(12) United States Patent
Holmes et al.

(10) Patent No.: US 11,316,022 B2
(45) Date of Patent: Apr. 26, 2022

(54) ION IMPLANT DEFINED NANOROD IN A SUSPENDED MAJORANA FERMION DEVICE

(71) Applicant: International Business Machines Corporation, Armonk, NY (US)

(72) Inventors: Steven J. Holmes, Ossining, NY (US); Devendra K. Sadana, Pleasantville, NY (US); Sean Hart, Tarrytown, NY (US); Patryk Gumann, Tarrytown, NY (US); Stephen W. Bedell, Wappingers Falls, NY (US); Ning Li, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 286 days.

(21) Appl. No.: 16/688,386

(22) Filed: Nov. 19, 2019

(65) Prior Publication Data
US 2021/0151575 A1    May 20, 2021

(51) Int. Cl.
*H01L 29/41*    (2006.01)
*G06N 10/00*    (2022.01)
(Continued)

(52) U.S. Cl.
CPC ............ *H01L 29/413* (2013.01); *B82Y 10/00* (2013.01); *B82Y 40/00* (2013.01); *G06N 10/00* (2019.01);
(Continued)

(58) Field of Classification Search
CPC ... H01L 29/413; H01L 29/0673; H01L 39/10; H01L 39/2493; B82Y 10/00; B82Y 40/00; G06N 10/00
See application file for complete search history.

(56) References Cited

U.S. PATENT DOCUMENTS 8,648,331 B2    2/2014 Bonderson et al.
9,489,634 B2    11/2016 Bonderson
(Continued)

FOREIGN PATENT DOCUMENTS

WO    2007/032802 A2    3/2007
WO    2017/153388 A1    9/2017
(Continued)

OTHER PUBLICATIONS

Zhang et al. "Next steps of quantum transport in Majorana nanowire devices," Nature communications (2019) 10:5128 | https://doi.org/10.1038/s41467-019-13133-1 | www.nature.com/naturecommunications Nov. 12, 2019 (Year: 2019).*

(Continued)

*Primary Examiner* — Matthew L Reames
(74) *Attorney, Agent, or Firm* — Amin, Turocy & Watson, LLP

(57) ABSTRACT

Devices, systems, methods, computer-implemented methods, apparatus, and/or computer program products that can facilitate a suspended Majorana fermion device comprising an ion implant defined nanorod in a semiconducting device are provided. According to an embodiment, a quantum computing device can comprise a Majorana fermion device coupled to an ion implanted region. The quantum computing device can further comprise an encapsulation film coupled to the ion implanted region and a substrate layer. The encapsulation film suspends the Majorana fermion device in the quantum computing device.

20 Claims, 25 Drawing Sheets

(51) Int. Cl.
   *B82Y 10/00*    (2011.01)
   *B82Y 40/00*    (2011.01)
   *H01L 29/06*    (2006.01)
   *H01L 39/10*    (2006.01)
   *H01L 39/24*    (2006.01)

(52) U.S. Cl.
   CPC .......... *H01L 29/0673* (2013.01); *H01L 39/10* (2013.01); *H01L 39/2493* (2013.01)

(56) References Cited

U.S. PATENT DOCUMENTS

| | | | |
|---|---|---|---|
| 9,559,284 | B2 | 1/2017 | Chang et al. |
| 9,570,563 | B2 | 2/2017 | Cohen et al. |
| 10,177,297 | B2 | 1/2019 | Marcus et al. |
| 11,107,966 | B2 * | 8/2021 | Holmes .................. G06N 10/00 |
| 2006/0269745 | A1 * | 11/2006 | Lee .................. H01L 21/31654 428/364 |
| 2012/0028806 | A1 | 2/2012 | Bonderson et al. |
| 2014/0050475 | A1 | 2/2014 | Bonderson et al. |
| 2014/0279822 | A1 | 9/2014 | Bonderson |
| 2014/0354326 | A1 | 12/2014 | Bonderson et al. |
| 2016/0035470 | A1 | 2/2016 | Yazdani et al. |
| 2017/0161632 | A1 | 6/2017 | Freedman et al. |
| 2018/0052806 | A1 | 2/2018 | Hastings et al. |
| 2018/0053113 | A1 | 2/2018 | Lutchyn et al. |
| 2018/0053809 | A1 | 2/2018 | Freedman et al. |
| 2019/0013457 | A1 | 1/2019 | Lutchyn et al. |
| 2019/0131513 | A1 | 5/2019 | Krogstrup et al. |
| 2020/0335884 | A1 | 10/2020 | Bulgajewski et al. |
| 2021/0143311 | A1 * | 5/2021 | Holmes .................. H01L 39/10 |

FOREIGN PATENT DOCUMENTS

| | | |
|---|---|---|
| WO | 2019/074557 A1 | 4/2019 |
| WO | 2019/180267 A1 | 9/2019 |

OTHER PUBLICATIONS

Invitation to pay additional fee received for PCT application No. PCT/EP2020/082086 dated Feb. 16, 2021, 11 pages.

Karzig, et al., Scalable designs for quasiparticle-poisoning-protected topological quantum computation with Majorana zero modes, Physical Review B, Jun. 21, 2017, p. 235305-01-235305-32, vol. 95, No. 23.

Dai, et al., Extracting entangled qubits from Majorana fermions in quantum dot chains through the measurement of parity. Scientific Reports, Jun. 10, 2015, 13 pages, vol. 5, 11188.

Shabani, et al., Two-dimensional epitaxial superconductor-semiconductor heterostructures: A platform for topological superconducting networks, Physical Review B, Apr. 1, 2016, 6 pages, vol. 93, No. 15, 155402.

Schneiderman, et al., Quasiparticle Poisoning in a Single Cooper-Pair Box, AIP Conference Proceedings, Sep. 1, 2006, 2 pages, vol. 850, No. 1.

Bomantara, et al., Simulation of Non-Abelian Braiding in Majorana Time Crystals, Phys Rev. Lett. 120, 230405, Jun. 7, 2018, 5 pages.

Jiang, et al., Interface Between Topological and Superconducting Qubits, Phys. Rev. Lett., Mar. 30, 2011, 12 pages.

Dai et al., Extracting entangled qubits from Majorana fermions in quantum dot chains through the measurement of parity, Oct. 31, 2014, 11 Pages.

International Search Report and Written Opinion received for PCT application serial No. PCT/EP2020/082086 dated May 18, 2021, 16 pages.

V. Mourik et al., "Signatures of Majorana Fermions in Hybrid Superconductor-Semiconductor Nanowire Devices", DOI: 10.1126/science.1222360, vol. 336, May 25, 2012, 6 pages.

* cited by examiner

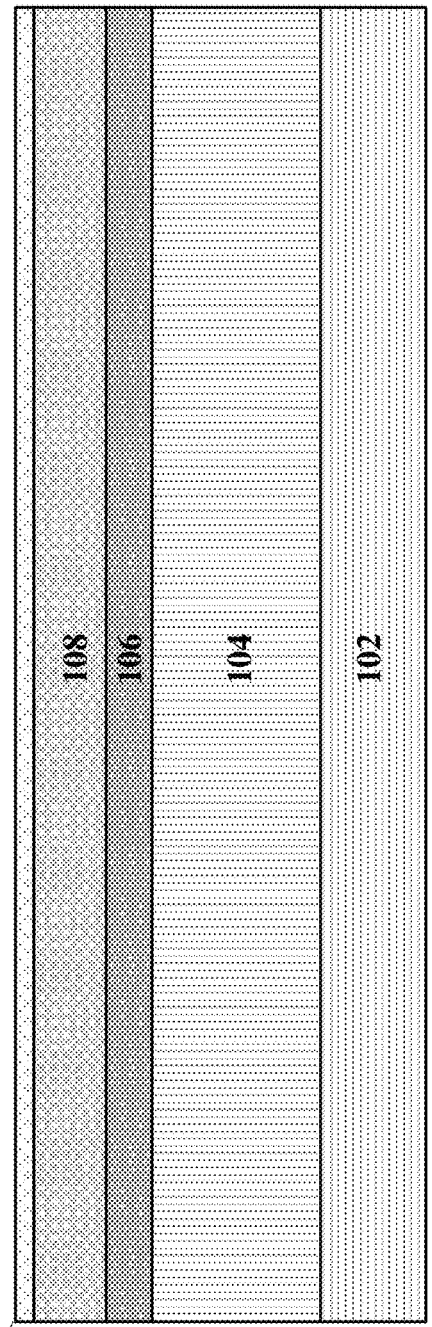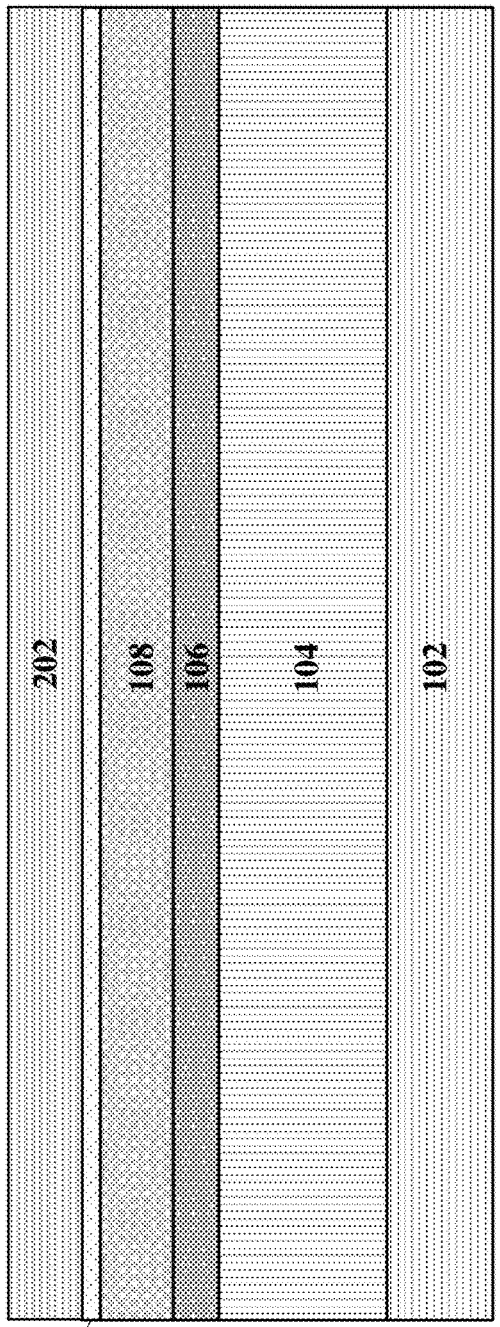
FIG. 1
FIG. 2

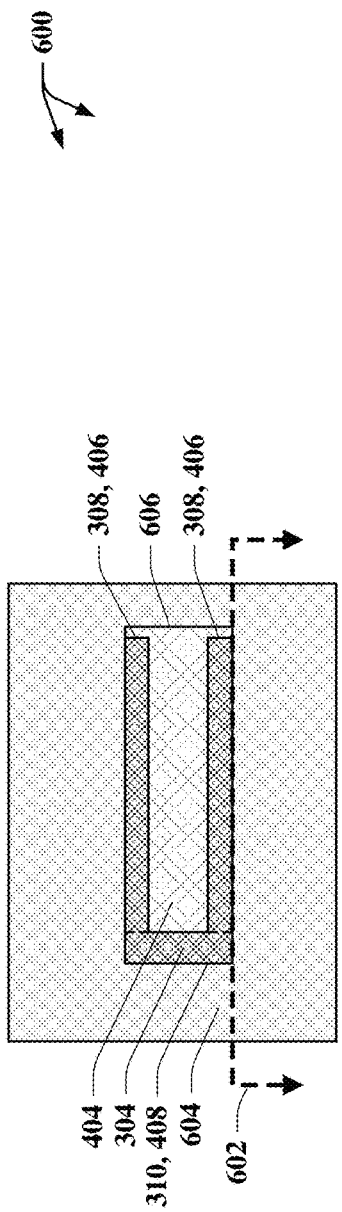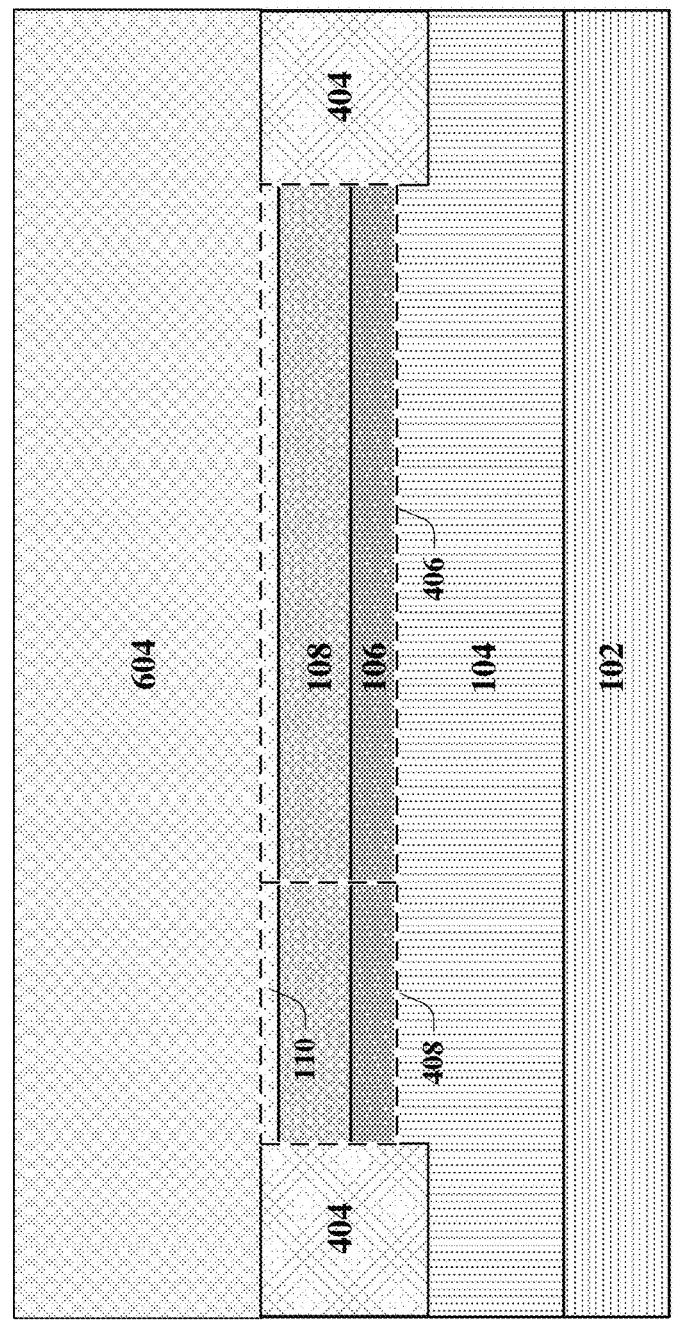

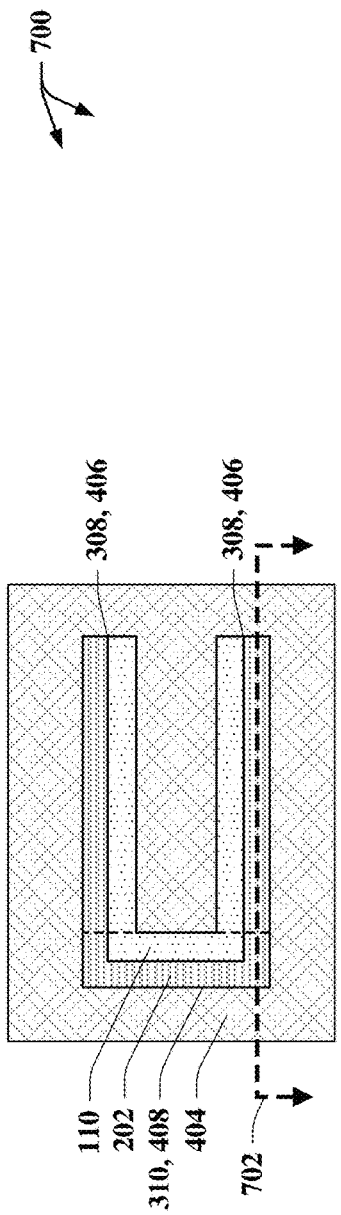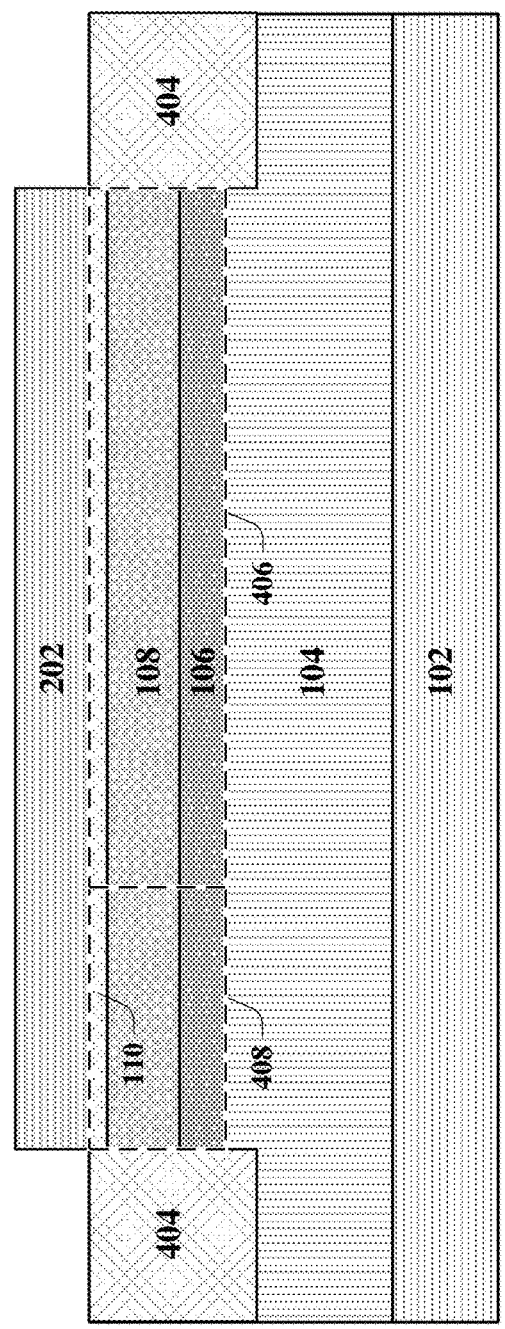
FIG. 7A
FIG. 7B

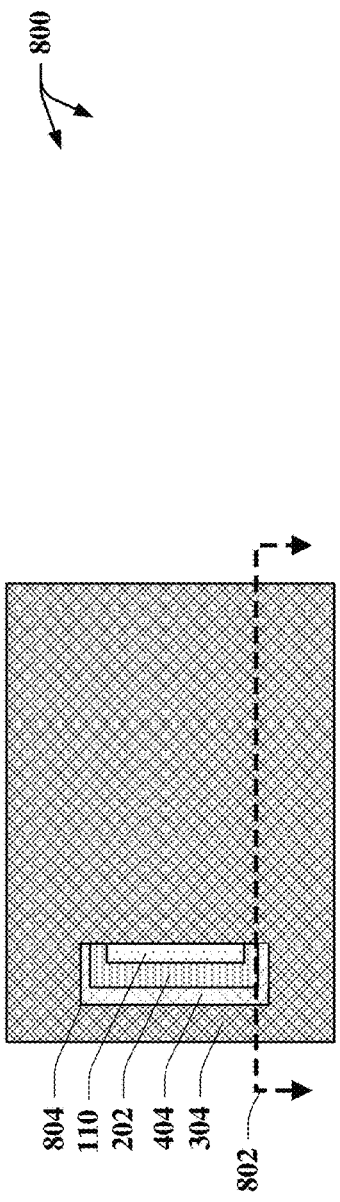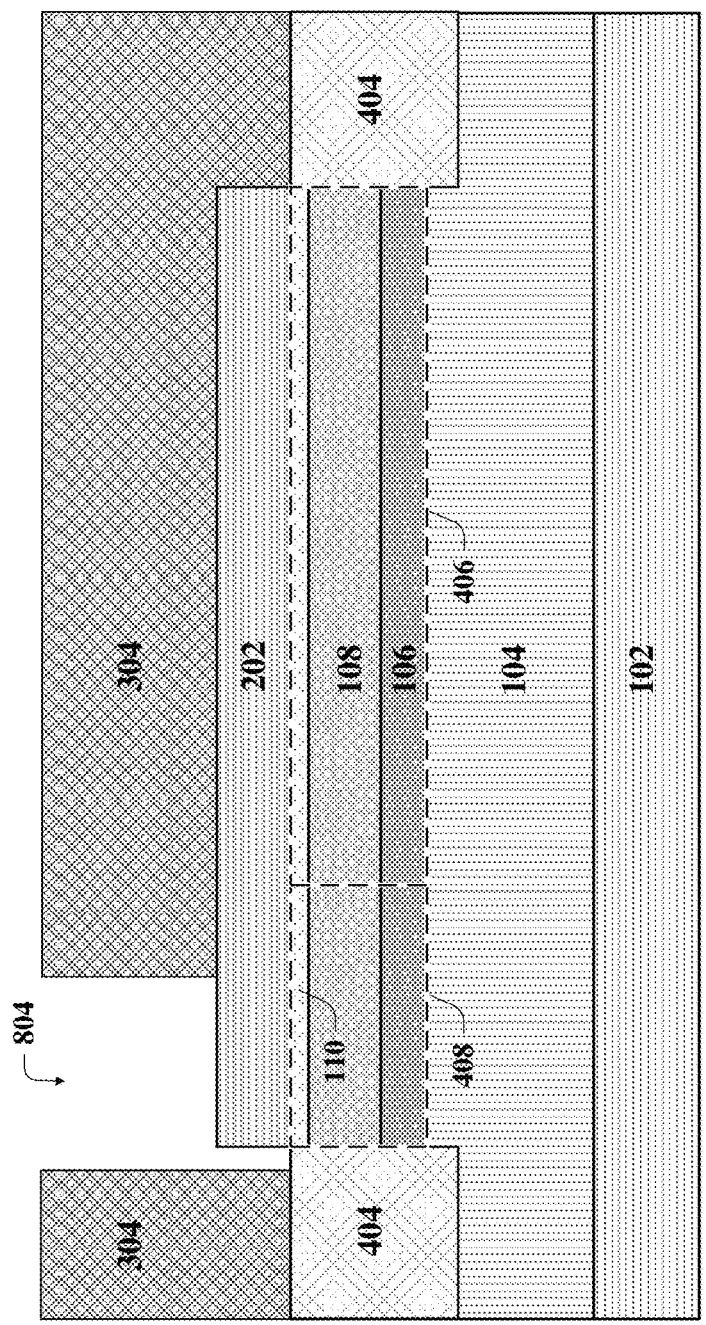

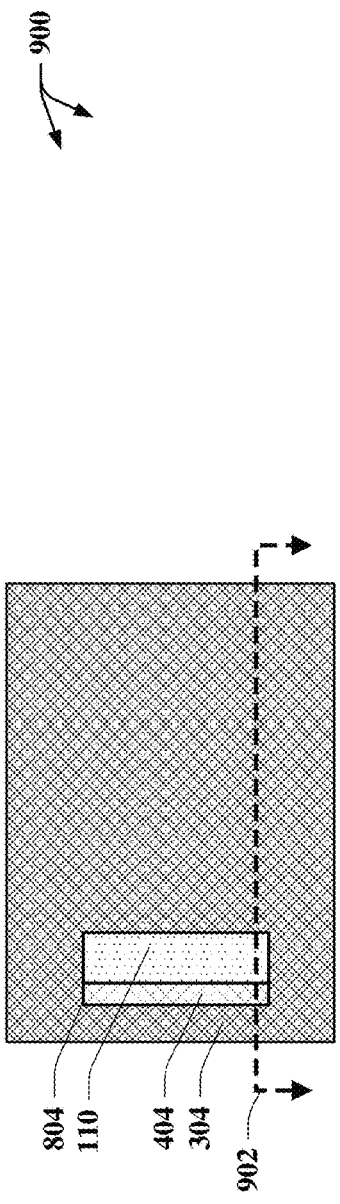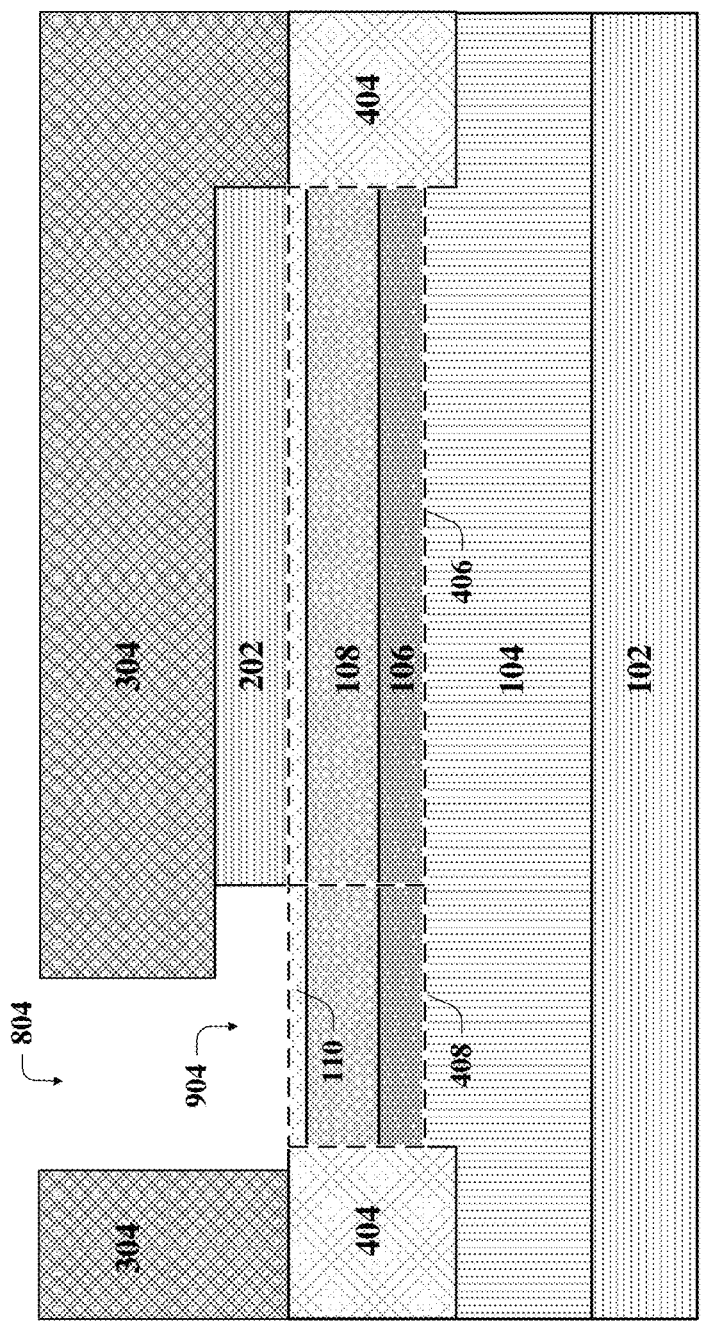

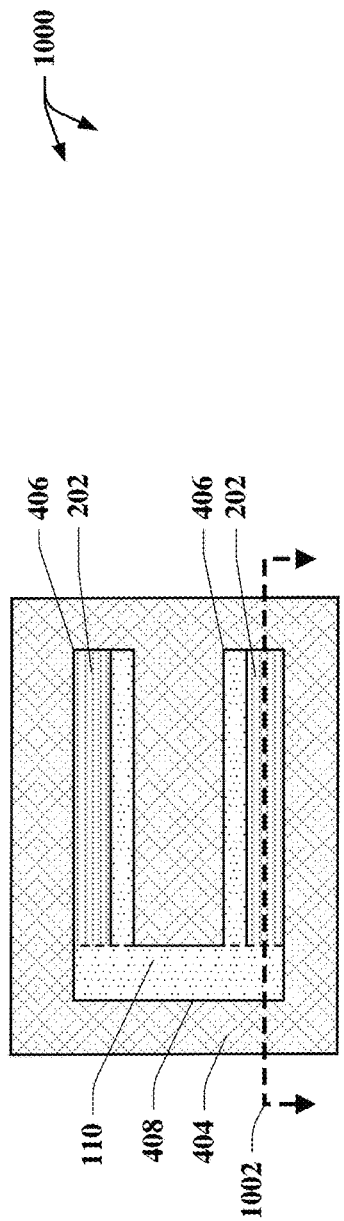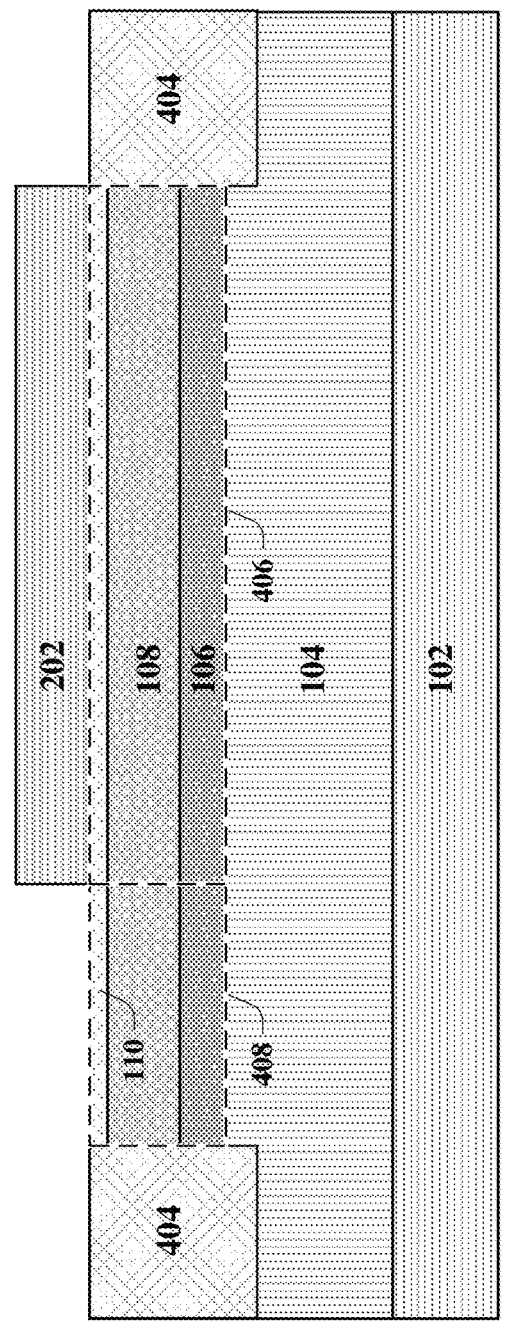

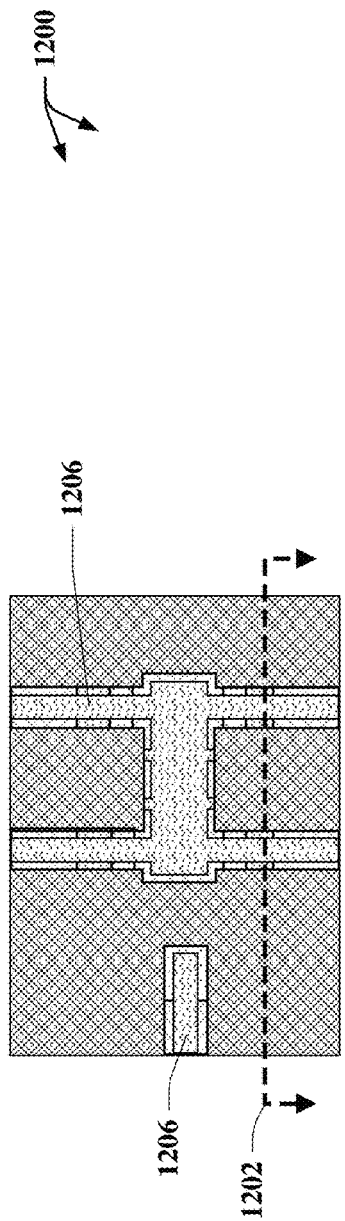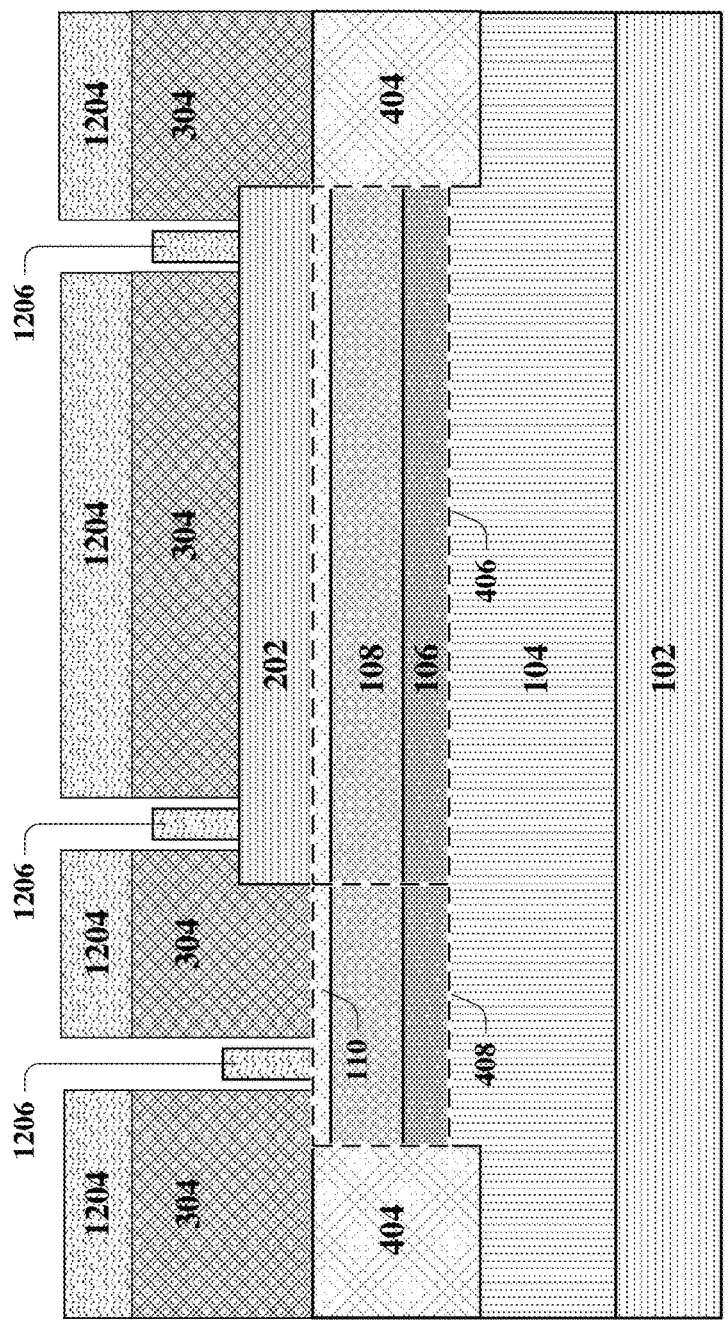
FIG. 12A
FIG. 12B

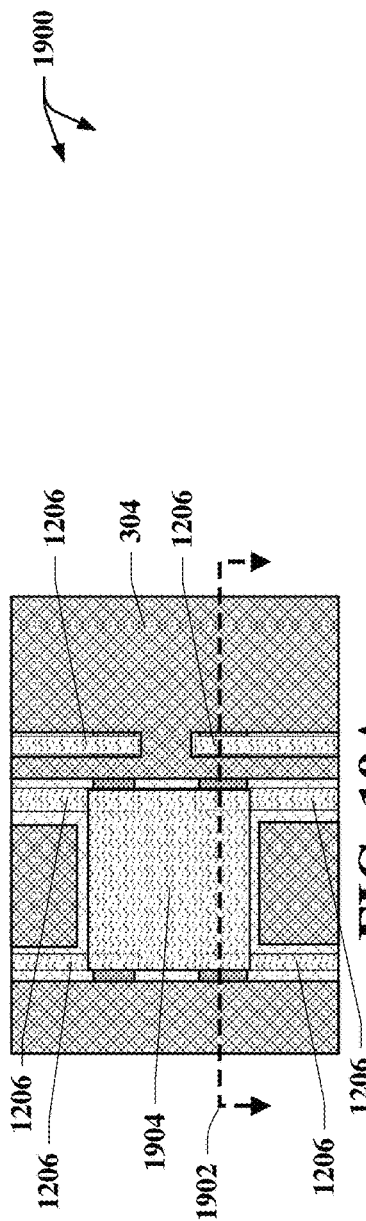
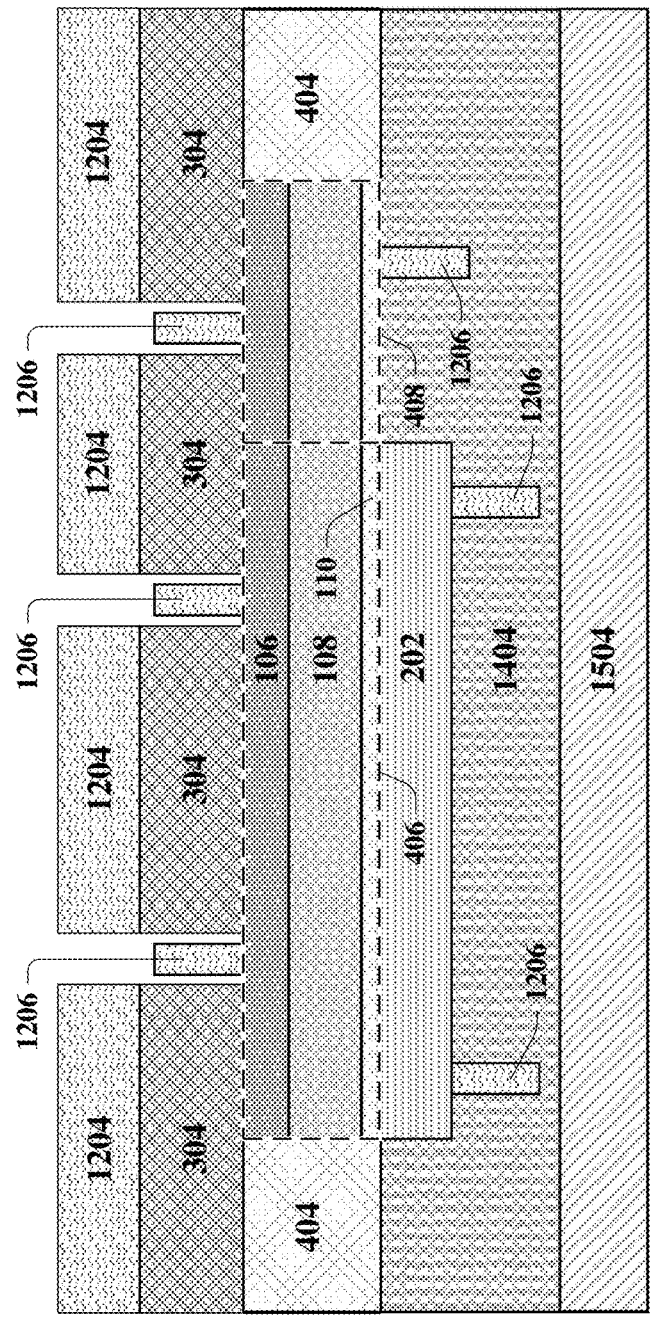

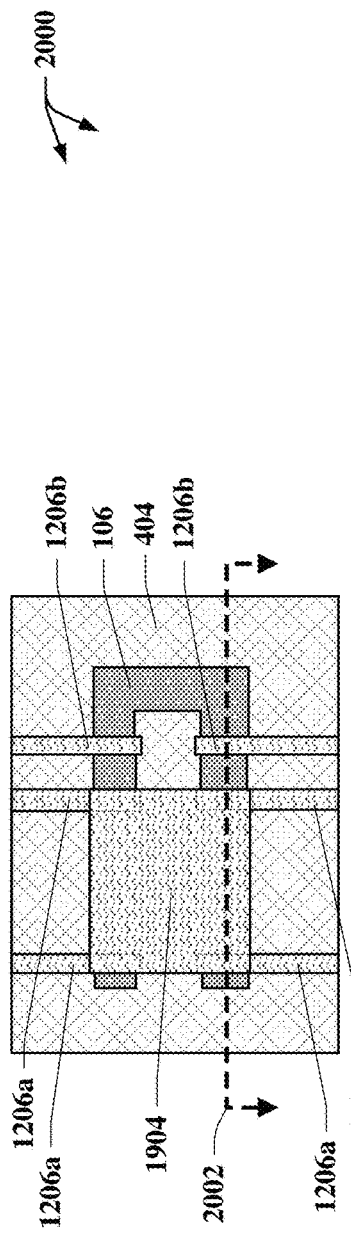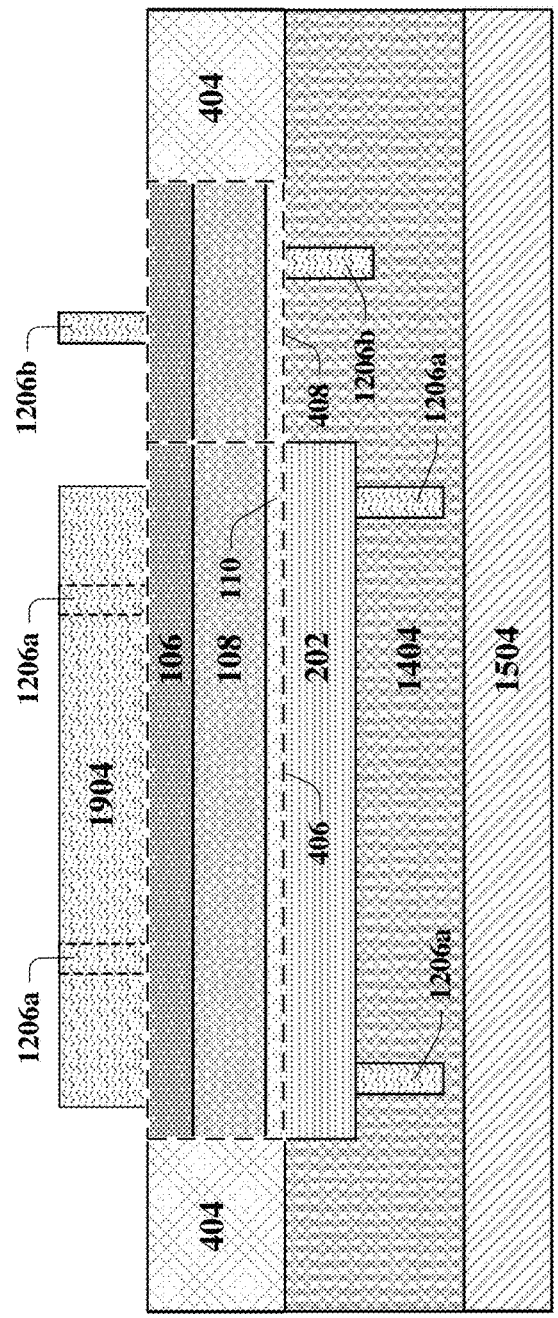
FIG. 20A
FIG. 20B

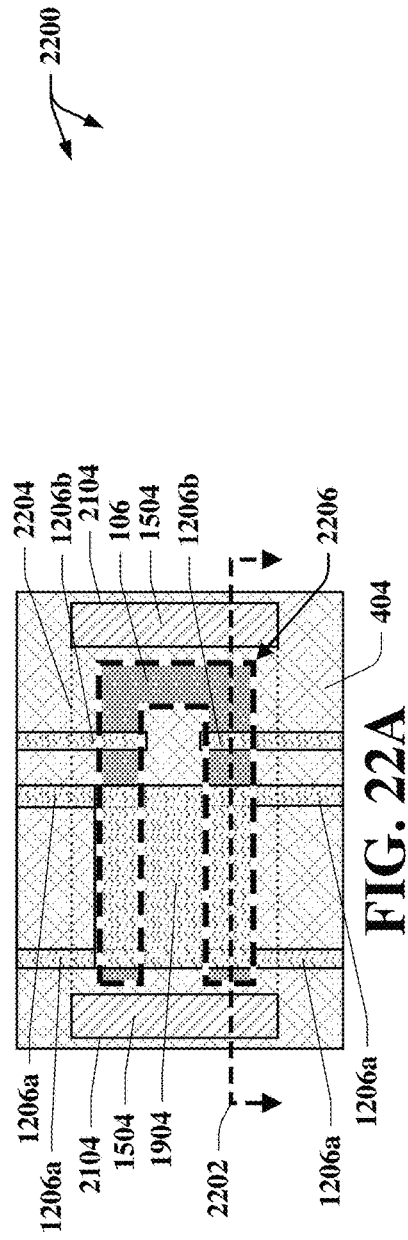
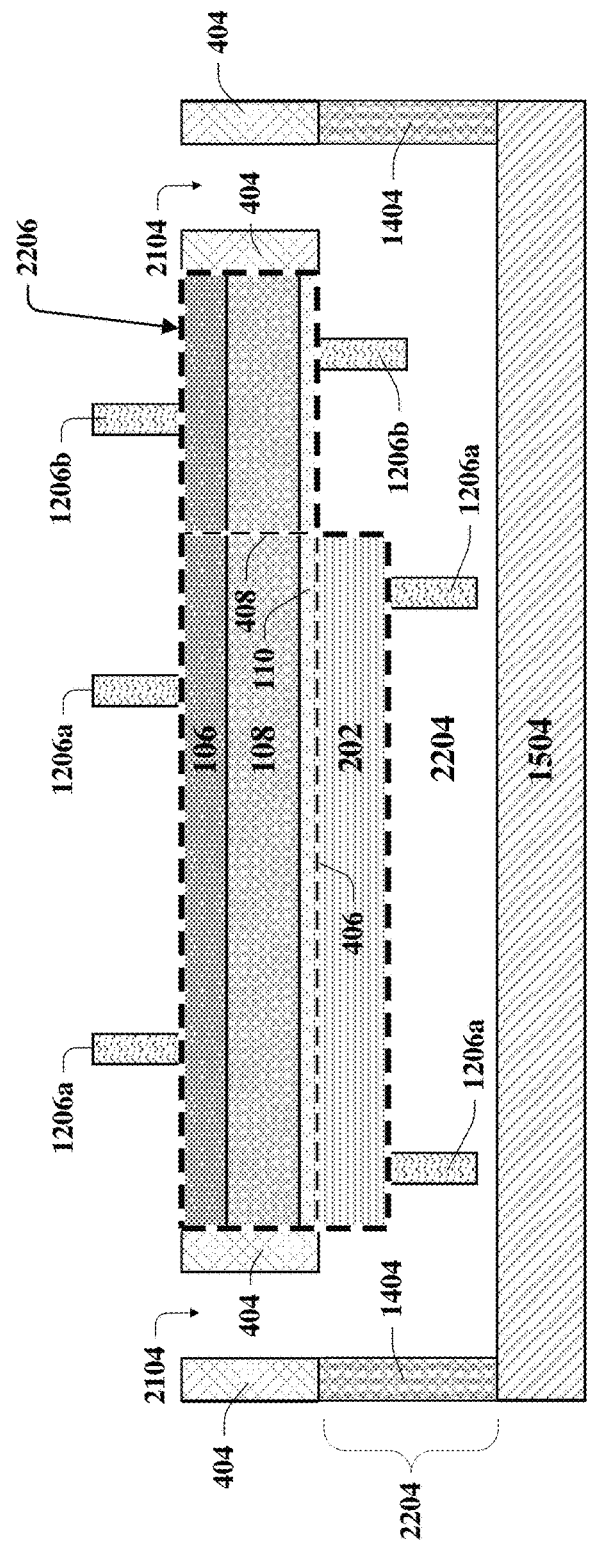

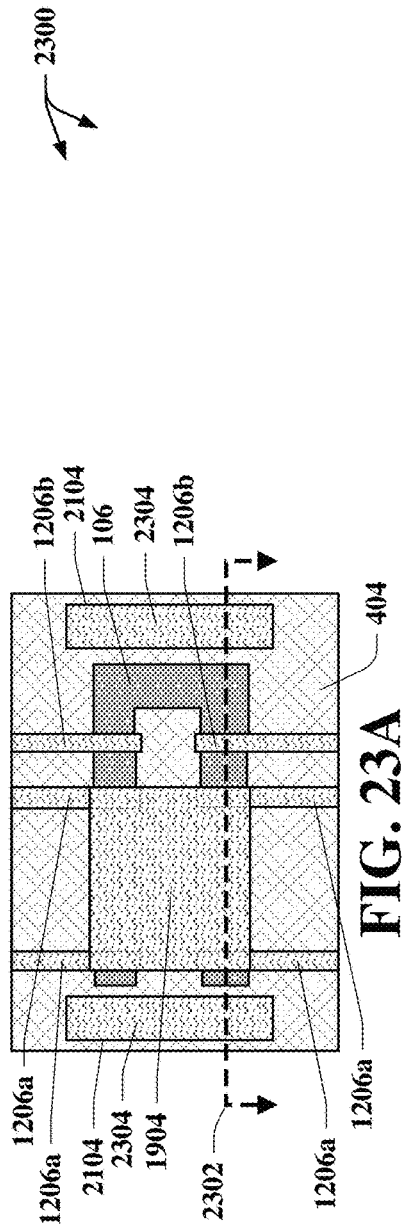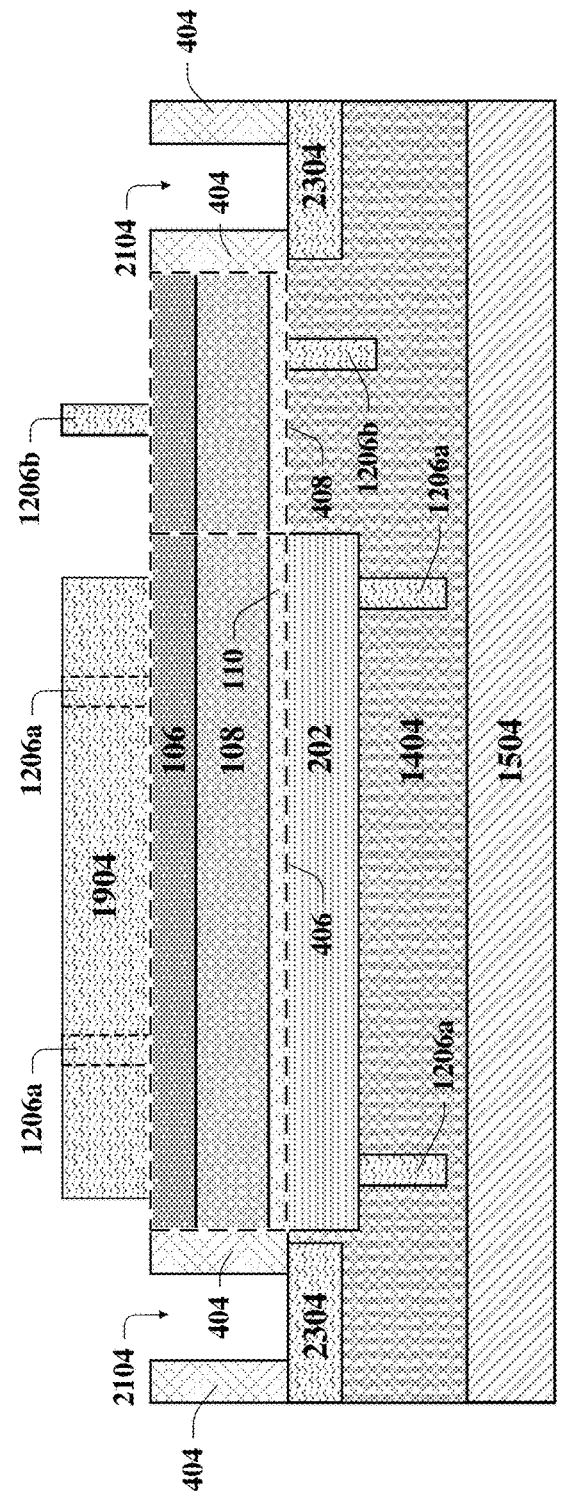
FIG. 23A
FIG. 23B

ION IMPLANT DEFINED NANOROD IN A SUSPENDED MAJORANA FERMION DEVICE

BACKGROUND

The subject disclosure relates to Majorana fermion devices and a method for forming the same. More specifically, the subject disclosure relates to an ion implant defined nanorod in a suspended Majorana fermion device and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate a suspended Majorana fermion device comprising an ion implant defined nanorod in a semiconducting device are described.

According to an embodiment, a quantum computing device can comprise a Majorana fermion device coupled to an ion implanted region. The quantum computing device can further comprise an encapsulation film coupled to the ion implanted region and a substrate layer. The encapsulation film suspends the Majorana fermion device in the quantum computing device.

According to an embodiment, a method can comprise forming an ion implanted region coupled to a Majorana fermion device in a quantum computing device. The method can further comprise forming an encapsulation film coupled to the ion implanted region and a substrate layer to suspend the Majorana fermion device in the quantum computing device.

According to an embodiment, a device can comprise a Majorana fermion device comprising an ion implant defined nanorod. The device can further comprise a superconducting layer coupled to the ion implant defined nanorod.

DESCRIPTION OF THE DRAWINGS

FIG. 1 illustrates a cross-sectional side view of an example, non-limiting device that can comprise multiple semiconductor layers formed on a substrate layer in accordance with one or more embodiments described herein.

FIG. 2 illustrates a cross-sectional side view of the example, non-limiting device of FIG. 1 after formation of a superconducting layer in accordance with one or more embodiments described herein.

FIGS. 6A and 6B illustrate a top view and a cross-sectional view, respectively, of the example, non-limiting device of FIGS. 5A and 5B after forming a second resist layer on and/or around the first resist layer in accordance with one or more embodiments described herein.

FIGS. 7A and 7B illustrate a top view and a cross-sectional view, respectively, of the example, non-limiting device of FIGS. 6A and 6B after performing a wet etch process to remove portions of the superconducting layer from the ion implant defined nanorods and after striping the first and second resist layers in accordance with one or more embodiments described herein.

FIGS. 8A and 8B illustrate a top view and a cross-sectional view, respectively, of the example, non-limiting device of FIGS. 7A and 7B after forming a resist layer in accordance with one or more embodiments described herein.

FIGS. 9A and 9B illustrate a top view and a cross-sectional view, respectively, of the example, non-limiting device of FIGS. 8A and 8B after performing a wet etch process to remove portions of the superconducting layer from a semiconducting layer in accordance with one or more embodiments described herein.

FIGS. 10A and 10B illustrate a top view and a cross-sectional view, respectively, of the example, non-limiting device of FIGS. 9A and 9B after striping the resist layer in accordance with one or more embodiments described herein.

FIGS. 12A and 12B illustrate a top view and a cross-sectional view, respectively, of the example, non-limiting device of FIGS. 11A and 11B after depositing a metal layer to form one or more wires in accordance with one or more embodiments described herein.

FIGS. 19A and 19B illustrate a top view and a cross-sectional view, respectively, of the example, non-limiting device of FIGS. 18A and 18B after depositing a metal layer to form one or more wires in accordance with one or more embodiments described herein.

FIGS. 20A and 20B illustrate a top view and a cross-sectional view, respectively, of the example, non-limiting device of FIGS. 19A and 19B after removing the resist layer and metal layer in accordance with one or more embodiments described herein.

FIGS. 22A and 22B illustrate a top view and a cross-sectional view, respectively, of the example, non-limiting device of FIGS. 21A and 21B after removal of one or more portions of the encapsulation film to form one or more hollow spaces and a suspended Majorana fermion device in accordance with one or more embodiments described herein.

FIGS. 23A and 23B illustrate a top view and a cross-sectional view, respectively, of the example, non-limiting device of FIGS. 21A and 21B after removal of one or more portions of the encapsulation film and deposition of one or more metal pads in accordance with one or more embodiments described herein.

DETAILED DESCRIPTION

Figure 3A:
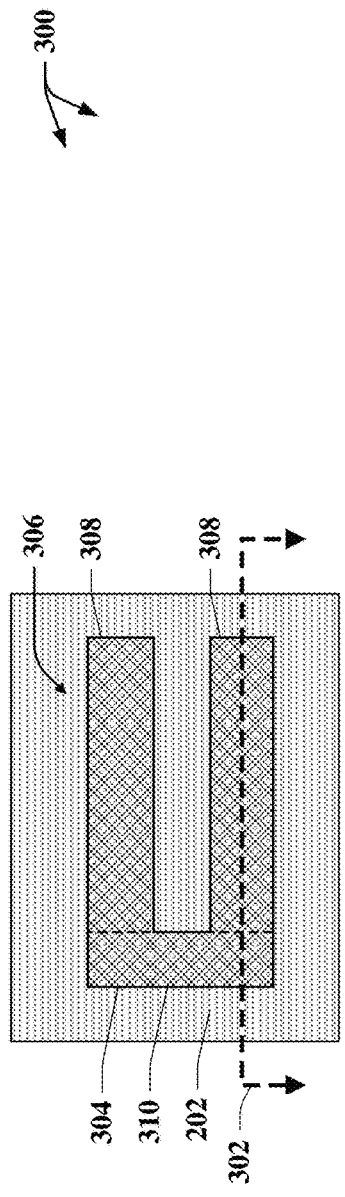
FIGS. 3A and 3B illustrate a top view and a cross-sectional view, respectively, of the example, non-limiting device of FIG. 2 after forming a first resist layer in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Some existing quantum computing technologies attempt to incorporate Majorana fermion quantum phenomena to leverage potential advantages of a Majorana fermion. A Majorana fermion (also referred to as a Majorana particle (quasiparticle)) is a fermion that has the property of being its own antiparticle. A Majorana fermion device (e.g., a Majorana fermion based device) can comprise a structure of semiconducting and/or superconducting materials that can mimic a Majorana fermion and/or facilitate measurement of observations that can be a characteristic of a Majorana fermion (e.g., behavior, functionality, property, etc.). For example, at the interface of a semiconducting nanorod and a superconducting material, superconducting behavior in the surface of the semiconducting nanorod can be observed that mimics characteristics of a Majorana fermion.

The Majorana fermion device described above can be implemented as a quantum device and/or a Majorana qubit in a quantum computing device. Such a quantum device and/or Majorana qubit offer the possibility of long coherence times and/or fast and possibly universal quantum computing. However, given the delicate nature of a Majorana fermion, fabrication of an effective and/or robust Majorana fermion device that can mimic a Majorana fermion using existing semiconductor and/or superconductor fabrication techniques is very difficult. Some examples of such challenges can include:

a) Fabrication of extremely high quality interfaces and films.

b) Conventional processing damages films (e.g., reactive-ion etching (RIE), cleans, air oxidation, etc.).

c) Dielectrics quench coherence, so the challenge is to make wiring structures without dielectric films separating structures (e.g., if they have trapped charges, and can make quasiparticles, uncontrolled electron density can result).

d) Integration of multiple elements such as, for instance, integration of nanorods (e.g., a III-V semiconducting nanorod such as indium arsenide (InAs), etc.) in contact with a superconductor (e.g., aluminum (Al)) to make the Majorana fermion device that behaves like a Majorana fermion; sensing regions (e.g., a quantum dot structure in proximity to a nanorod); tunnel junction gates (e.g., to control an interaction between a quantum dot structure and a nanorod); chemical potential control gates (e.g., to change the chemical potential of a nanorod by changing the voltage on the gate to facilitate setting the nanorod to a zero energy point needed to mimic Majorana fermion characteristics); contacts and circuit wires; semiconducting connections for sensing regions; and/or other elements.

FIGS. 1-24 illustrate an example, non-limiting multi-step fabrication sequence that can be implemented to fabricate one or more embodiments of the subject disclosure described herein and/or illustrated in the figures. For example, the non-limiting multi-step fabrication sequence illustrated in FIGS. 1-24 can be implemented to fabricate a suspended Majorana fermion device comprising one or more ion implant defined nanorods in a semiconducting device. For instance, in accordance with one or more embodiments described herein, the non-limiting multi-step fabrication sequence illustrated in FIGS. 1-24 can be implemented to fabricate devices 100 to 2400, where devices 100 to 2100 and/or 2300 can be developed into devices 2200 and/or 2400 as described below. Devices 2200 and/or 2400 can comprise quantum computing devices (e.g., quantum circuit, quantum hardware, quantum processor, quantum computer, etc.) comprising one or more a Majorana fermion devices 2206 having one or more ion implant defined nanorods 406 (e.g., as illustrated in FIGS. 22A, 22B, 24A, and 24B), where Majorana fermion device 2206 can comprise a suspended Majorana fermion device. In an example, device 2200 can comprise a Majorana fermion device 2206 that can be implemented in device 2400 as a Majorana qubit, where device 2400 can comprise a quantum processor.

As described below with reference to FIGS. 1-24, fabrication of the various embodiments of the subject disclosure described herein and/or illustrated in the figures (e.g., device 2200, Majorana fermion device 2206, ion implant defined nanorods 406, etc.) can comprise a multi-step sequence of, for example, photolithographic and/or chemical processing steps that facilitate gradual creation of electronic-based systems, devices, components, and/or circuits in a semiconducting device (e.g., an integrated circuit). For instance, the various embodiments of the subject disclosure described herein and/or illustrated in the figures (e.g., device 2200, Majorana fermion device 2206, ion implant defined nanorods 406, etc.) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

As described below with reference to FIGS. 1-24, fabrication of the various embodiments of the subject disclosure described herein and/or illustrated in the figures (e.g., device 2200, Majorana fermion device 2206, ion implant defined nanorods 406, etc.) can be fabricated using various materials. For example, the various embodiments of the subject disclosure described herein and/or illustrated in the figures (e.g., device 2200, Majorana fermion device 2206, ion implant defined nanorods 406, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, physical coupling, operative coupling, optical coupling, thermal coupling, and/or another type of coupling.

FIG. 1 illustrates a cross-sectional side view of an example, non-limiting device 100 that can comprise multiple semiconductor layers formed on a substrate layer in accordance with one or more embodiments described herein. Device 100 can comprise one or more III-V semiconductor compound layers formed on a substrate layer as described below.

Device 100 can comprise a substrate layer 102. Substrate layer 102 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate layer 102 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. Substrate layer 102 can comprise a thickness ranging from approximately 200 micrometers ($\mu m$) to approximately 750 $\mu m$.

Device 100 can further comprise a first III-V semiconductor compound layer 104 (referred to herein as first III-V layer 104) formed on substrate layer 102. First III-V layer 104 can comprise a III-V semiconductor compound including, but not limited to, indium aluminum arsenide (InAlAs) and/or another III-V semiconductor compound. First III-V layer 104 can be formed on substrate 102 using one or more deposition processes including, but not limited to, PVD, CVD, ALD, PECVD, spin-on coating, sputtering, and/or another deposition process. In an embodiment, first III-V layer 104 can comprise a buffer layer. In another embodiment, first III-V layer 104 can comprise a thickness (e.g., height) ranging from approximately 200 nanometers (nm) to approximately 2 $\mu m$.

Device 100 can further comprise one or more additional III-V semiconductor compound layers that can comprise one or more epitaxial films formed (e.g., grown) on first III-V layer 104. For example, device 100 can comprise a second III-V semiconductor compound layer 106 (referred to herein as second III-V layer 106) formed on first III-V layer 104. In this example, second III-V layer 106 can comprise a III-V semiconductor compound comprising an epitaxial film including, but not limited to, indium gallium arsenide (InGaAs) and/or another epitaxial film. In an embodiment, second III-V layer 106 can comprise a protective layer.

In another example, device 100 can comprise a third III-V semiconductor compound layer 108 (referred to herein as third III-V layer 108) formed on second III-V layer 106. In this example, third III-V layer 108 can comprise a III-V semiconductor compound comprising an epitaxial film including, but not limited to, indium arsenide (InAs) and/or another epitaxial film.

In another example, example, device 100 can comprise a fourth III-V semiconductor compound layer 110 (referred to herein as fourth III-V layer 110) formed on third III-V layer 108. In this example, fourth III-V layer 110 can comprise a III-V semiconductor compound comprising an epitaxial film including, but not limited to, indium gallium arsenide (InGaAs) and/or another epitaxial film. In an embodiment, fourth III-V layer 110 can comprise a protective layer.

The second III-V layer 106, third III-V layer 108, and/or fourth III-V layer 110 defined above that can comprise epitaxial films can be grown on first III-V layer 104 using an epitaxial film growth process (e.g., epitaxial deposition) performed in an epitaxial growth furnace. For example, second III-V layer 106, third III-V layer 108, and/or fourth III-V layer 110 can be grown on first III-V layer 104 together in situ during the same fabrication phase (e.g., in situ epitaxial film growth performed in an epitaxial growth furnace). Utilizing such an in situ epitaxial film growth process to grow second III-V layer 106, third III-V layer 108, and/or fourth III-V layer 110 on first III-V layer 104 in such a manner can facilitate desirable crystallinity of each layer (film), as well as prevent oxidation and/or defects at the interfaces between each of such layers (e.g., at the interfaces between second III-V layer 106, third III-V layer 108, and/or fourth III-V layer 110) and/or at the interface between first III-V layer 104 and second III-V layer 106.

The second III-V layer 106, third III-V layer 108, and/or fourth III-V layer 110 defined above can be formed into one or more semiconductor nanorods comprising one or more quantum wells of a Majorana fermion device as described below, where third III-V layer 108 can comprise an active layer. For example, second III-V layer 106, third III-V layer 108, and/or fourth III-V layer 110 can be formed into one or more ion implant defined nanorods of a Majorana fermion device suspended in a semiconductor device, where third III-V layer 108 can comprise an active layer. For instance, second III-V layer 106, third III-V layer 108, and/or fourth III-V layer 110 can be formed into one or more ion implant defined nanorods 406 of Majorana fermion device 2206 as described below and illustrated in FIGS. 22A and 22B, where third III-V layer 108 can comprise an active layer.

First III-V layer 104, an epitaxial semiconductor, can be epitaxially grown on substrate layer 102. Material for first III-V layer 104 can be selected based on the composition of substrate layer 102 and second III-V layer 106. In one embodiment, first III-V layer 104 is formed of indium aluminum arsenide (InAlAs), to match the crystal lattice of adjacent second III-V layer 106. In one embodiment, first III-V layer 104 has a gradual change in composition from substrate layer 102 to second III-V layer 106 to avoid creating crystal defects (e.g. dislocations) in second III-V layer 106. In one embodiment, the gradual change in composition is a linear change. For example, if substrate layer 102 comprises gallium arsenide (GaAs) and second III-V layer 106 comprises indium arsenide (InAs), growing a sufficiently high quality layer of InAs directly on the GaAs of substrate layer 102 is difficult. Thus, first III-V layer 104 begins at substrate layer 102 with GaAs, and the gallium is gradually replaced with indium to eventually match the InAs of second III-V layer 106. These examples of materials are not intended to be limiting. From this disclosure those of ordinary skill in the art will be able to conceive of many other materials suitable for forming first III-V layer 104 and the same are contemplated within the scope of the illustrative embodiments.

Second III-V layer 106, an epitaxial semiconductor, can be epitaxially grown on first III-V layer 104. Materials for second III-V layer 106 and fourth III-V layer 110 are selected based on the composition of third III-V layer 108, to provide crystal quality above a particular quality threshold. In an embodiment, using InAs in a one-to-one ratio for third III-V layer 108, indium gallium arsenide (InGaAs) using a 0.8 In to 1 Ga to 0.2 As ratio is used for second III-V layer 106 and fourth III-V layer 110. In an embodiment, using indium gallium arsenide (InGaAs) using a 0.7 In to 1 Ga to 0.3 As ratio for third III-V layer 108, indium gallium arsenide (InGaAs) using a 0.53 In to 1 Ga to 0.47 As ratio or a 0.52 In to 1 Ga to 0.48 As ratio is used for second III-V layer 106 and fourth III-V layer 110. In an embodiment, using indium antimonide (InSb) for third III-V layer 108, In0.80-0.90Al0.1-0.2Sb (aluminum indium antimonide (InAlSb) using a 1 In to 0.8-0.9 Al to 0.1-0.2 Sb ratio) is used for second III-V layer 106 and fourth III-V layer 110. In an embodiment, using indium phosphide (InP) as a substrate, second III-V layer 106 is lattice matched to the InP of substrate layer 102. However, second III-V layer 106 and fourth III-V layer 110 can be formed using the same material or different material. In addition, in some embodiments, fourth III-V layer 110 is not formed. These examples of materials are not intended to be limiting. From this disclosure those of ordinary skill in the art will be able to conceive of many other materials suitable for forming second III-V layer 106 and fourth III-V layer 110 and the same are contemplated within the scope of the illustrative embodiments. In one embodiment, second III-V layer 106 is approximately 4 nm thick, although a thicker or thinner layer is also possible and contemplated within the scope of the illustrative embodiments.

Third III-V layer 108 can be epitaxially grown on second III-V layer 106. In embodiments, third III-V layer 108 is formed of indium arsenide (InAs) using a one-to-one In:As ratio, indium gallium arsenide (InGaAs) using a 0.7 In to 1 Ga to 0.3 As ratio, or indium antimony (InSb). These examples of substrate materials are not intended to be limiting. From this disclosure those of ordinary skill in the art will be able to conceive of many other materials suitable for forming substrate layer 102 and the same are contemplated within the scope of the illustrative embodiments. In one embodiment, third III-V layer 108 is approximately 7 nm thick, although a thicker or thinner layer is also possible and contemplated within the scope of the illustrative embodiments.

Fourth III-V layer 110, an epitaxial semiconductor, can be epitaxially grown on third III-V layer 108. In one embodiment, fourth III-V layer 110 is approximately 5 nm thick, although a thicker or thinner layer is also possible and contemplated within the scope of the illustrative embodiments. Second III-V layer 106 and fourth III-V layer 110 protect surfaces of third III-V layer 108 from damage during fabrication. A damaged portion of third III-V layer 108 could degrade device properties. Thus, if the risk of damage during fabrication is sufficiently low, fourth III-V layer 110 may not be formed on third III-V layer 108. In addition, second III-V layer 106 and fourth III-V layer 110 can be the same material or different materials.

FIG. 2 illustrates a cross-sectional side view of the example, non-limiting device 100 of FIG. 1 after formation of a superconducting layer to form a Majorana fermion device in accordance with one or more embodiments described herein. Repetitive description of like elements and/or processes employed in other embodiments described herein is omitted for sake of brevity.

Device 200 can comprise an example, non-limiting alternative embodiment of device 100 after formation of a superconducting layer 202. Superconducting layer 202 can comprise one or more superconducting materials, including but not limited to, aluminum (AL), and/or another superconducting material. In an embodiment, superconducting layer 202 can comprise a thickness (e.g., height) ranging from approximately 5 nm to approximately 50 nm.

Superconducting layer 202 can be formed (e.g., grown) on fourth III-V layer 110 using an epitaxial film growth process (e.g., epitaxial deposition) performed in an epitaxial growth furnace. In an embodiment, superconducting layer 202 can be grown on fourth III-V layer 110 using the same epitaxial film growth process performed in the same epitaxial growth furnace that can be used to grow second III-V layer 106, third III-V layer 108, and/or fourth III-V layer 110 as described above. For instance, second III-V layer 106, third III-V layer 108, fourth III-V layer 110, and/or superconducting layer 202 can be grown together in situ during the same fabrication phase (e.g., in situ epitaxial film growth performed in an epitaxial growth furnace). Utilizing such an in situ epitaxial film growth process to grow second III-V layer 106, third III-V layer 108, fourth III-V layer 110, and/or superconducting layer 202 in such a manner can facilitate desirable crystallinity of each layer, as well as prevent oxidation and/or defects at the interfaces between each of such layers (e.g., at the interfaces between second III-V layer 106, third III-V layer 108, and/or fourth III-V layer 110) and/or at the interface between fourth III-V layer 110 and superconducting layer 202.

As described above, second III-V layer 106, third III-V layer 108, and/or fourth III-V layer 110 can be formed into one or more semiconductor nanorods of a Majorana fermion device (e.g., formed into one or more ion implant defined nanorods 406 of Majorana fermion device 2206 as described below and illustrated in FIGS. 22A and 22B). The formation of superconducting layer 202 on fourth III-V layer 110 as described above can provide the formation of a superconducting material on such one or more semiconductor nanorods that can enable observation of one or more Majorana fermion behaviors and/or characteristics at the interface of superconducting layer 202 and fourth III-V layer 110.

Figure 3B:
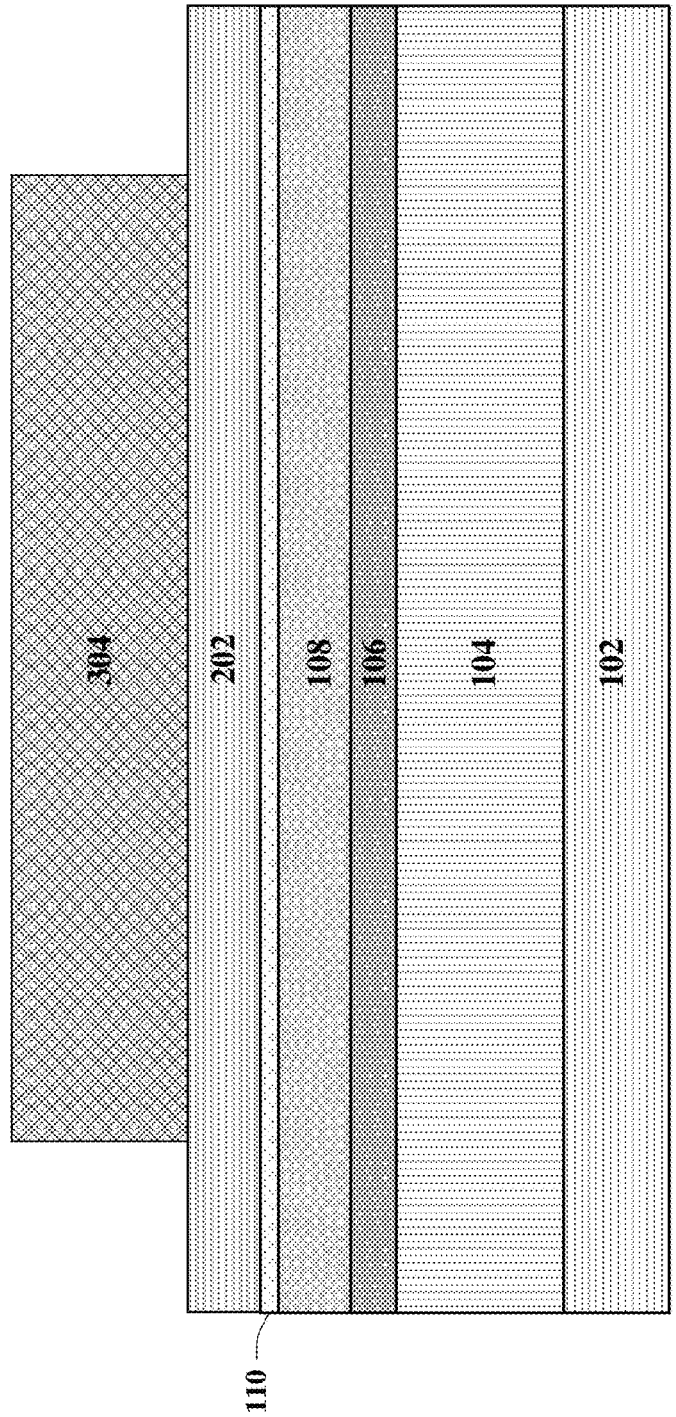

FIG. 3A illustrates a top view of a first side of the example, non-limiting device 200 of FIG. 2 after forming a resist layer in accordance with one or more embodiments described herein. In an example, the first side of device 200 can comprise a first side of device 300 illustrated in FIG. 3A, which can comprise a top side of device 300. FIG. 3B illustrates a cross-sectional side view of device 300 as viewed along a plane defined by line 302. Repetitive description of like elements and/or processes employed in other embodiments described herein is omitted for sake of brevity.

Device 300 can comprise an example, non-limiting alternative embodiment of device 200 after formation of a first resist layer 304. First resist layer 304 can comprise a photoresist material that can be formed on superconducting layer 202 using one or more photolithography, patterning, and/or photoresist techniques defined above (e.g., a lithographic patterning process). First resist layer 304 can comprise a photoresist including, but not limited to, a positive-tone photoresist, a negative-tone photoresist, a hybrid-tone photoresist, and/or another photoresist.

First resist layer 304 can comprise a pattern resist that can be used to define a region of device 300 that can be developed into a Majorana fermion device and/or one or more components thereof. For example, first resist layer 304 can comprise a pattern resist that can be used as an ion implant mask to define superconductor regions and/or quantum well regions for Majorana nanowire(s) (e.g., nanorod(s)) and/or quantum dots, as well as regions for semiconductor links between quantum dots (e.g., as described below).

In an example, first resist layer 304 can be used as an ion implant mask to define region 306 illustrated in FIG. 3A comprising a "U" shaped region of device 300 that can be developed into a Majorana fermion device comprising one or more ion implant defined nanorods and/or one or more ion implant defined sensing regions. In this example, "U" shaped region 306 can comprise one or more subregions 308 that can be formed such that they extend along the plane defined by line 302 (e.g., parallel to the plane defined by line 302) as illustrated in FIG. 3A, where such subregion(s) 308 can be developed into one or more ion implant defined nanorods of a Majorana fermion device (e.g., one or more ion implant defined nanorods 406 of Majorana fermion device 2206). In these examples, "U" shaped region 306 can further comprise subregion 310 that can be formed such that it extends perpendicular to the plane defined by line 302 as illustrated in FIG. 3A, where such subregion 310 can be developed into one or more ion implant defined sensing regions comprising one or more quantum dots of a Majorana fermion device (e.g., one or more ion implant defined sensing regions 408 of Majorana fermion device 2206).

Although region 306 is depicted in FIG. 3A in a "U" shaped configuration, it is to be understood that the various embodiments of the subject disclosure described herein are not so limiting. For example, region 306 can comprise a variety of different configurations (e.g., an "E," an "F," an "H," a "K," an "L," a "T," etc.) that can be used to define a Majorana fermion device and/or one or more components thereof as described above in accordance with one or more embodiments described herein. Additionally, or alternatively, although the "U" shaped configuration of region 306 can yield a quantity of two (2) of such ion implant defined nanorods and a quantity of one (1) of such ion implant defined sensing regions described above, it is to be understood that the various embodiments of the subject disclosure described herein are not so limiting. For example, using different configurations to form region 306 can respectively yield various quantities of such ion implant defined nanorods and/or such ion implant defined sensing regions described above.

Figure 4A:
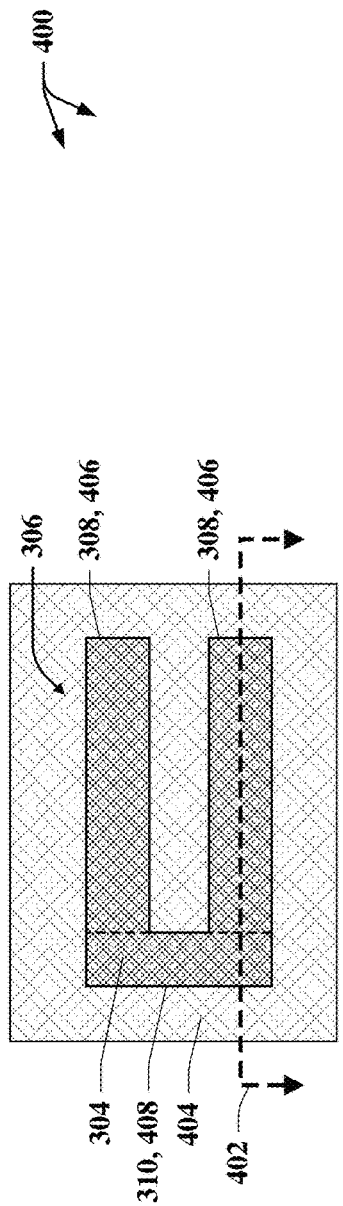
FIGS. 4A and 4B illustrate a top view and a cross-sectional view, respectively, of the example, non-limiting device of FIGS. 3A and 3B after performing an ion implantation process to form ion implant defined nanorods and an ion implant defined sensing region in accordance with one or more embodiments described herein.
Figure 4B:
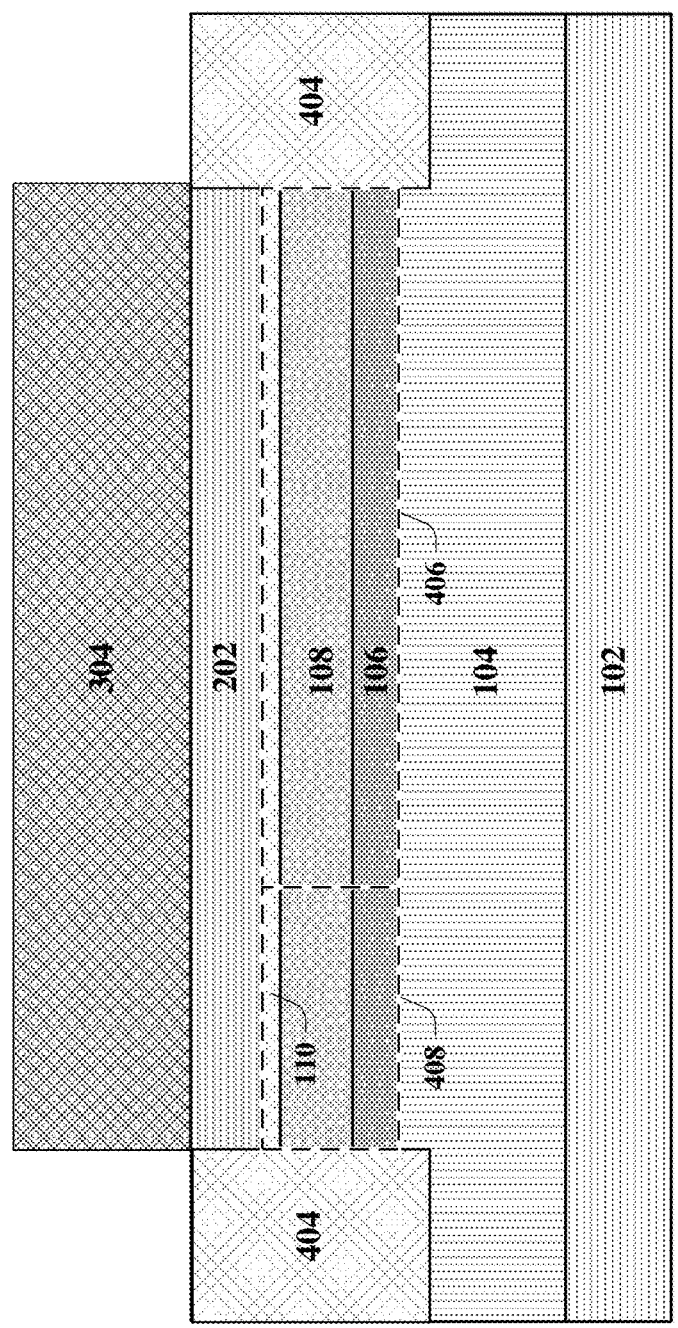

FIG. 4A illustrates a top view of a first side of the example, non-limiting device 300 of FIGS. 3A and 3B after performing an ion implantation process to form ion implant defined nanorods and an ion implant defined sensing region in accordance with one or more embodiments described herein. In an example, the first side of device 300 can comprise a first side of device 400 illustrated in FIG. 4A, which can comprise a top side of device 400. FIG. 4B illustrates a cross-sectional side view of device 400 as viewed along a plane defined by line 402. Repetitive description of like elements and/or processes employed in other embodiments described herein is omitted for sake of brevity.

Device 400 can comprise an example, non-limiting alternative embodiment of device 300 after an ion implantation process is performed to form ion implanted region 404 illustrated in FIGS. 4A and 4B, thereby facilitating definition of one or more circuit regions of device 400. For example, an ion implantation process can be performed to implant a low dose ion implant into second III-V layer 106, third III-V layer 108, and/or fourth III-V layer 110 to define circuit regions of a Majorana fermion device (e.g., Majorana fermion device 2206). For instance, an ion implantation process can be performed to implant a low dose ion implant including, but not limited to, helium (He), hydrogen ($H_2$), oxygen ($O_2$), argon (Ar), gallium (Ga), and/or another ion implant into second III-V layer 106, third III-V layer 108, and/or fourth III-V layer 110 to define the one or more ion implant defined nanorods and/or the one or more ion implant defined sensing regions comprising one or more quantum dots described above.

An ion implantation process as described above can be used to define such circuit regions of a Majorana fermion device (e.g., Majorana fermion device 2206) as ion implantation deactivates the conductivity of (e.g., by disrupting the crystal structure of) III-V semiconductor compound materials, thus effectively making such materials insulators. Based on performing such an ion implantation process as described above using a "U" shaped first resist layer 304 to define region 306, ion implant defined nanorods 406 depicted as dashed lines in FIG. 4B can be defined in subregions 308 depicted in FIG. 4A. Additionally, or alternatively, based on performing such an ion implantation process using a "U" shaped first resist layer 304 to define region 306, an ion implant defined sensing region 408 depicted as dashed lines in FIG. 4B can be defined in subregion 310 depicted in FIG. 4A, where such an ion implant defined sensing region 408 can comprise one or more quantum dots.

For example, ion implant defined nanorods 406 can comprise the portions of second III-V layer 106, third III-V layer 108, and/or fourth III-V layer 110 that are depicted as dashed lines in FIG. 4B and are within subregions 308. In this example, as such regions of second III-V layer 106, third III-V layer 108, and/or fourth III-V layer 110 will remain conductive after ion implantation of all other regions of device 400, they can therefore be defined as circuit regions of a Majorana fermion device. In another example, ion implant defined sensing region 408 can comprise the portions of second III-V layer 106, third III-V layer 108, and/or fourth III-V layer 110 that are depicted as dashed lines in FIG. 4B and are within subregion 310. In this example, as such regions of second III-V layer 106, third III-V layer 108, and/or fourth III-V layer 110 will remain conductive after ion implantation of all other regions of device 400, they can therefore be defined as circuit regions of a Majorana fermion device. In the examples provided above, ion implant defined nanorods 406 and/or ion implant defined sensing region 408 can be defined as circuit regions of a Majorana fermion device because performing such an ion implantation process can deactivate the conductivity of (e.g., by disrupting the crystal structure of) second III-V layer 106, third III-V layer 108, and/or fourth III-V layer 110 in all areas where it is implanted as illustrated by ion implanted region 404 in FIGS. 4A and 4B, as such ion implanted region 404 has dielectric properties after ion implantation is performed.

Performing such an ion implantation process described above can effectively yield an ion implanted region 404 coupled to superconducting layer 202, ion implant defined nanorods 406, and/or ion implant defined sensing region 408, which can comprise components of a Majorana fermion device. Such formation of ion implanted region 404 coupled to superconducting layer 202, ion implant defined nanorods 406, and/or ion implant defined sensing region 408 can enable suspension of a Majorana fermion device in a quantum computing device. For example, with reference to FIGS. 22A and 22B, such formation of ion implanted region 404 coupled to superconducting layer 202, ion implant defined nanorods 406, and/or ion implant defined sensing region 408 can enable suspension of Majorana fermion device 2206 in device 2200 after removal of a portion of encapsulation film 1404 as described below.

Utilizing such an ion implantation process can prevent damaging the materials of device 400 that can be caused by using other techniques to define such circuit regions such as, for instance, reactive-ion etching (RIE) and/or clean processes. For example, such an ion implantation process can prevent damaging the regions of second III-V layer 106, third III-V layer 108, and/or fourth III-V layer 110 comprising ion implant defined nanorods 406 and/or ion implant defined sensing region 408. In this example, such an ion implantation process can also prevent damage to superconducting layer 202.

In an embodiment, subregions 308 and/or ion implant defined nanorods 406 can each comprise a length ranging from approximately 20 nm to approximately 1,000 nm and/or a width ranging from approximately 5 nm to approximately 200 nm. In another embodiment, subregion 310 and/or ion implant defined sensing region 408 can comprise a length ranging from approximately 20 nm to approximately 1,000 nm and/or a width ranging from approximately 5 nm to approximately 200 nm.

Figure 5A:
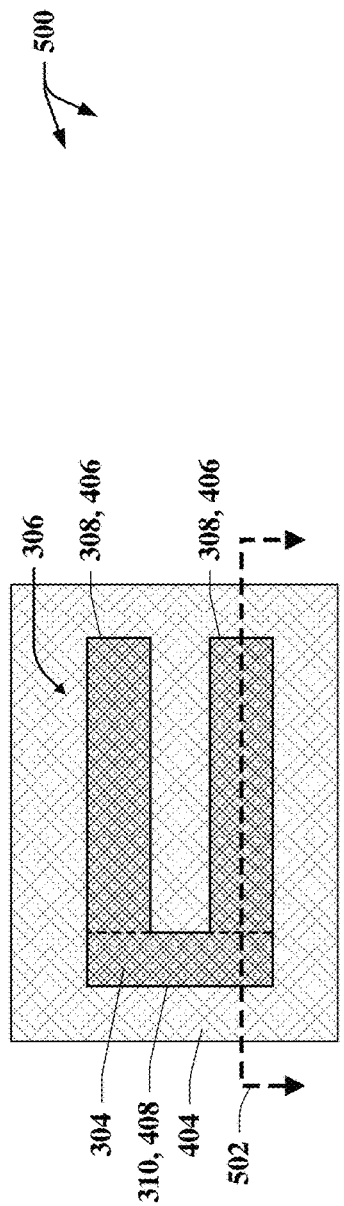
FIGS. 5A and 5B illustrate a top view and a cross-sectional view, respectively, of the example, non-limiting device of FIGS. 4A and 4B after performing a wet etch process to remove portions of the superconducting layer in accordance with one or more embodiments described herein.
Figure 5B:
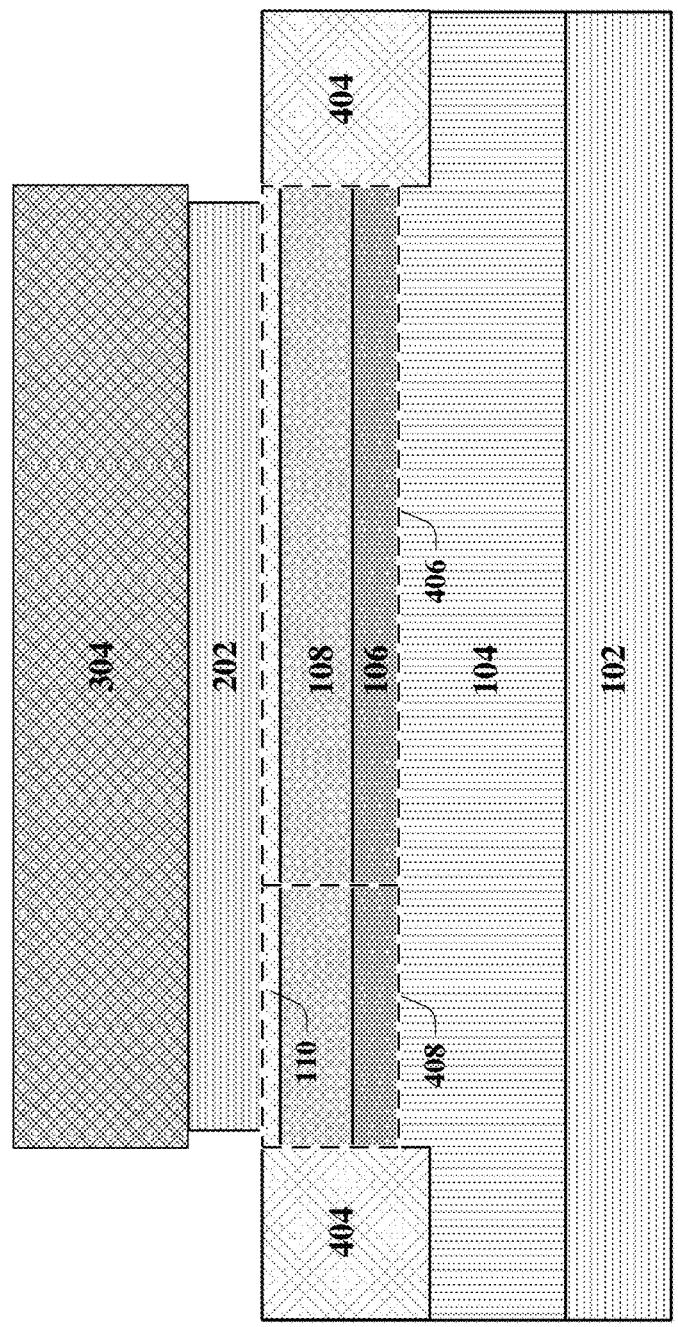

FIG. 5A illustrates a top view of a first side of the example, non-limiting device 400 of FIGS. 4A and 4B after performing a wet etch process to remove portions of the superconducting layer in accordance with one or more embodiments described herein. In an example, the first side of device 400 can comprise a first side of device 500 illustrated in FIG. 5A, which can comprise a top side of device 500. FIG. 5B illustrates a cross-sectional side view of device 500 as viewed along a plane defined by line 502. Repetitive description of like elements and/or processes employed in other embodiments described herein is omitted for sake of brevity.

Device 500 can comprise an example, non-limiting alternative embodiment of device 400 after performing a wet etch process on superconducting layer 202 to remove all portions of superconducting layer 202 except the portions remaining under first resist layer 304 as depicted in FIGS. 5A and 5B. For example, a wet etch process using tetramethylammonium hydroxide (TMAH) can be performed to remove such sections of superconducting layer 202, thereby facilitating alignment of superconducting layer 202 over ion implant defined nanorods 406 and/or ion implant defined sensing region 408.

FIG. 6A illustrates a top view of a first side of the example, non-limiting device 500 of FIGS. 5A and 5B after forming a second resist layer on and/or around the first resist layer in accordance with one or more embodiments described herein. In an example, the first side of device 500 can comprise a first side of device 600 illustrated in FIG. 6A, which can comprise a top side of device 600. FIG. 6B illustrates a cross-sectional side view of device 600 as viewed along a plane defined by line 602. Repetitive description of like elements and/or processes employed in other embodiments described herein is omitted for sake of brevity.

Device 600 can comprise an example, non-limiting alternative embodiment of device 500 after forming a second resist layer 604 on and/or around first resist layer 304 as depicted in FIGS. 6A and 6B. Second resist layer 604 can comprise one or more of the photoresist materials defined above that can be formed on and/or around first resist layer 304 as depicted in FIGS. 6A and 6B using one or more photolithography, patterning, and/or photoresist techniques defined above (e.g., a lithographic patterning process).

Second resist layer 604 can comprise a pattern resist that can be used to pattern an opening 606 illustrated in FIG. 6A that defines a portion of superconducting layer 202 that will be removed to enable formation of one or more control gates vertically across ion implant defined nanorods 406. In some embodiments (not illustrated in the figures), for example, in embodiments employing a bonded approach, second resist layer 604 is not applied.

Opening 606 defined by second resist layer 604 can enable removal of portions of superconducting layer 202 from a side (e.g., a surface) of each of the ion implant defined nanorods 406, thereby exposing such a side of each of the ion implant defined nanorods 406 while leaving all other portions of superconducting layer 202 undisturbed (e.g., keeping portions of superconducting layer 202 coupled to (e.g., communicatively, electrically, operatively, optically, physically, etc.) ion implant defined nanorods 406). Opening 606 defined by second resist layer 604 can enable such removal of the portions of superconducting layer 202 described above and illustrated in FIG. 6A to enable formation of one or more control gates (e.g., wires 1206a, 1206b described below and illustrated in FIGS. 22A and 22B) vertically across ion implant defined nanorods 406 such that a voltage can be applied to ion implant defined nanorods 406 that will not be blocked by superconducting layer 202 (e.g., electrical field will not be screened by superconducting layer 202). Such a voltage can be applied to ion implant defined nanorods 406 to adjust the potential of ion implant defined nanorods 406.

FIG. 7A illustrates a top view of a first side of the example, non-limiting device 600 of FIGS. 6A and 6B after performing a wet etch process to remove portions of the superconducting layer from the ion implant defined nanorods and after striping the first and second resist layers in accordance with one or more embodiments described herein. In an example, the first side of device 600 can comprise a first side of device 700 illustrated in FIG. 7A, which can comprise a top side of device 700. FIG. 7B illustrates a cross-sectional side view of device 700 as viewed along a plane defined by line 702. Repetitive description of like elements and/or processes employed in other embodiments described herein is omitted for sake of brevity.

Device 700 can comprise an example, non-limiting alternative embodiment of device 600 after performing a wet etch process to remove the portions of superconducting layer 202 from ion implant defined nanorods 406 as described above and after striping first resist layer 304 and second resist layer 604.

In an example, a wet etch process using tetramethylammonium hydroxide (TMAH) can be performed to remove such portions of superconducting layer 202 from ion implant defined nanorods 406, thereby exposing a surface of each of the ion implant defined nanorods 406 to which one or more control gates described above can be coupled (e.g., wires 1206a, 1206b described below and illustrated in FIGS. 22A and 22B). For instance, a wet etch process using TMAH can be performed to remove such portions of superconducting layer 202 from ion implant defined nanorods 406, thereby exposing a surface of fourth III-V layer 110 in each of the ion implant defined nanorods 406 as illustrated in FIG. 7A, where one or more control gates described above can be coupled to such a surface of fourth III-V layer 110 in one or both of the ion implant defined nanorods 406. Based on performing such a wet etch process, first resist layer 304 and second resist layer 604 can be stripped (e.g., removed and/or washed off) using an organic solvent.

FIG. 8A illustrates a top view of a first side of the example, non-limiting device 700 of FIGS. 7A and 7B after forming a resist layer in accordance with one or more embodiments described herein. In an example, the first side of device 700 can comprise a first side of device 800 illustrated in FIG. 8A, which can comprise a top side of device 800. FIG. 8B illustrates a cross-sectional side view of device 800 as viewed along a plane defined by line 802. Repetitive description of like elements and/or processes employed in other embodiments described herein is omitted for sake of brevity.

Device 800 can comprise an example, non-limiting alternative embodiment of device 700 after forming a resist layer that can comprise first resist layer 304 on portions of device 700 as illustrated in FIGS. 8A and 8B. First resist layer 304 can comprise one or more of the photoresist materials defined above that can be formed using one or more photolithography, patterning, and/or photoresist techniques defined above (e.g., a lithographic patterning process). First resist layer 304 can comprise a pattern resist that can be used to pattern an opening 804 illustrated in FIG. 8A that defines a portion of superconducting layer 202 that will be removed from fourth III-V layer 110, thereby enabling further development of ion implant defined sensing region 408 by exposing a surface (e.g., a top surface) of ion implant defined sensing region 408.

FIG. 9A illustrates a top view of a first side of the example, non-limiting device 800 of FIGS. 8A and 8B after performing a wet etch process to remove portions of the superconducting layer from a semiconducting layer in accordance with one or more embodiments described herein. In an example, the first side of device 800 can comprise a first side of device 900 illustrated in FIG. 9A, which can comprise a top side of device 900. FIG. 9B illustrates a cross-sectional side view of device 900 as viewed along a plane defined by line 902. Repetitive description of like elements and/or processes employed in other embodiments described herein is omitted for sake of brevity.

Device 900 can comprise an example, non-limiting alternative embodiment of device 800 after performing a wet etch process to remove portions of superconducting layer 202 from fourth III-V layer 110 as illustrated by openings 804 and 904 depicted in FIGS. 8A, 8B, 9A and 9B. Removal of such portions of superconducting layer 202 from fourth III-V layer 110 can enable further development of ion implant defined sensing region 408 as described below. In an example, a wet etch process using TMAH can be performed to remove such portions of superconducting layer 202 from fourth III-V layer 110.

FIG. 10A illustrates a top view of a first side of the example, non-limiting device 900 of FIGS. 9A and 9B after striping the resist layer in accordance with one or more embodiments described herein. In an example, the first side of device 900 can comprise a first side of device 1000 illustrated in FIG. 10A, which can comprise a top side of device 1000. FIG. 10B illustrates a cross-sectional side view of device 1000 as viewed along a plane defined by line 1002. Repetitive description of like elements and/or processes employed in other embodiments described herein is omitted for sake of brevity.

Device 1000 can comprise an example, non-limiting alternative embodiment of device 900 after striping first resist layer 304. In an example, first resist layer 304 can be stripped (e.g., removed and/or washed off) using an organic solvent.

Figure 11A:
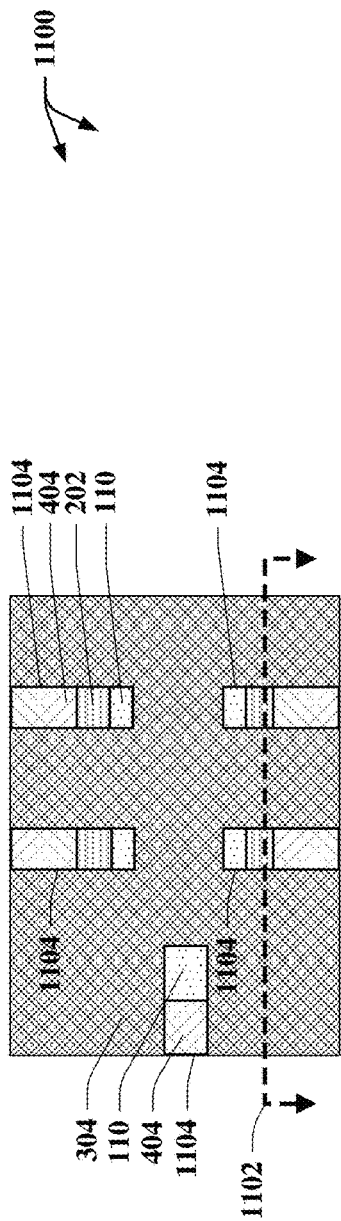
FIGS. 11A and 11B illustrate a top view and a cross-sectional view, respectively, of the example, non-limiting device of FIGS. 10A and 10B after forming a resist layer in accordance with one or more embodiments described herein.
Figure 11B:
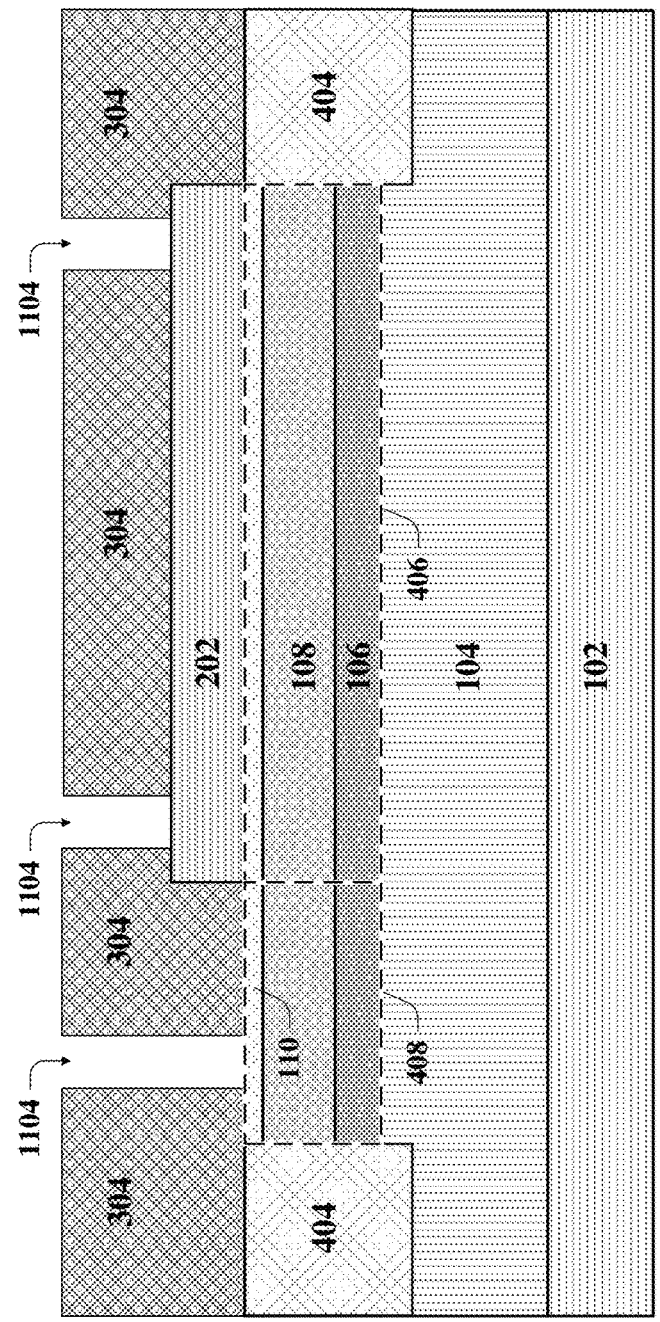

FIG. 11A illustrates a top view of a first side of the example, non-limiting device 1000 of FIGS. 10A and 10B after forming a resist layer in accordance with one or more embodiments described herein. In an example, the first side of device 1000 can comprise a first side of device 1100 illustrated in FIG. 11A, which can comprise a top side of device 1100. FIG. 11B illustrates a cross-sectional side view of device 1100 as viewed along a plane defined by line 1102. Repetitive description of like elements and/or processes employed in other embodiments described herein is omitted for sake of brevity.

Device 1100 can comprise an example, non-limiting alternative embodiment of device 1000 after forming a resist layer that can comprise first resist layer 304 on portions of device 1000 as illustrated in FIGS. 11A and 11B. First resist layer 304 can comprise one or more of the photoresist materials defined above that can be formed using one or more photolithography, patterning, and/or photoresist techniques defined above (e.g., a lithographic patterning process). First resist layer 304 can comprise a pattern resist that can be used to pattern one or more openings 1104, for instance, as illustrated in FIGS. 11A and 11B that define areas of device 1100 onto which one or more contact gates (e.g., electrical contacts) can be coupled (e.g., communicatively, electrically, operatively, optically, physically, etc.). For example, first resist layer 304 can comprise a pattern resist that can be used to pattern one or more openings 1104, for instance, as illustrated in FIGS. 11A and 11B that define areas on one or more surfaces (e.g., top surfaces) of ion implant defined nanorods 406 and/or ion implant defined sensing region 408 onto which one or more contact gates can be coupled. In an example, first resist layer 304 can comprise a lift-off structure having an undercut profile, where metal can be evaporated onto such a lift-off structure to enable formation of the one or more contact gates described above.

FIG. 12A illustrates a top view of a first side of the example, non-limiting device 1100 of FIGS. 11A and 11B after depositing a metal layer to form one or more wires in accordance with one or more embodiments described herein. In an example, the first side of device 1100 can comprise a first side of device 1200 illustrated in FIG. 12A, which can comprise a top side of device 1200. FIG. 12B illustrates a cross-sectional side view of device 1200 as viewed along a plane defined by line 1202. Repetitive description of like elements and/or processes employed in other embodiments described herein is omitted for sake of brevity.

Device 1200 can comprise an example, non-limiting alternative embodiment of device 1100 after: cleaning surfaces (e.g., top surfaces) of fourth III-V layer 110 and superconducting layer 202; depositing metal layer 1204 onto device 1100; and/or washing device 1100 with a solvent, thereby forming one or more wires 1206 coupled to one or more surfaces of device 1100. For example, device 1200 can comprise an example, non-limiting alternative embodiment of device 1100 after: cleaning top surfaces of fourth III-V layer 110 and superconducting layer 202; depositing metal layer 1204 onto the top surfaces of fourth III-V layer 110 (e.g., top surfaces of ion implant defined nanorods 406 and/or ion implant defined sensing region 408) using a metal evaporation process; and/or washing device 1100 with an organic solvent to form one or more wires 1206 coupled to the top surfaces of fourth III-V layer 110 (e.g., top surfaces of ion implant defined nanorods 406 and/or ion implant defined sensing region 408). Metal layer 1204 can be formed such that wire(s) 1206 can comprise a thickness (e.g., height) ranging from approximately 5 nm to approximately 100 nm and/or a width ranging from approximately 5 nm to approximately 50 nm. As described below with reference to FIGS. 22A, 22B, and 24, wire(s) 1206 can comprise wires 1206a, 1206b which can be coupled to Majorana fermion device 2206 and to one or more electrically conductive components of support region(s) 2402 on device 2400, where device 2400 can comprise a quantum computing device.

Metal layer 1204 and/or one or more wires 1206 can comprise electrically conductive components through which electrical current (e.g., alternating current and/or direct current), electrical signals (e.g., microwave frequency signals, etc.), and/or optical signals can flow. Metal layer 1204 and/or one or more wires 1206 can be deposited (e.g., via a metal evaporation process) onto first resist layer 304, fourth III-V layer 110, and/or superconducting layer 202 of device 1100 using one or more materials, including but not limited to, aluminum (Al), copper, copper alloys (e.g., copper nickel), gold, platinum, palladium, gold alloys (e.g., gold palladium), brass, and/or any other electrically conductive metal or alloy. In an example, one or more wires 1206 can comprise one or more electrically conductive components including, but not limited to, a control wire, a tunnel junction gate, a pinch gate, a chemical potential control gate, a sensing wire, a semiconductor connector, an electrode, a circuit wire, a contact, and/or another electrically conductive component.

Figure 13A:
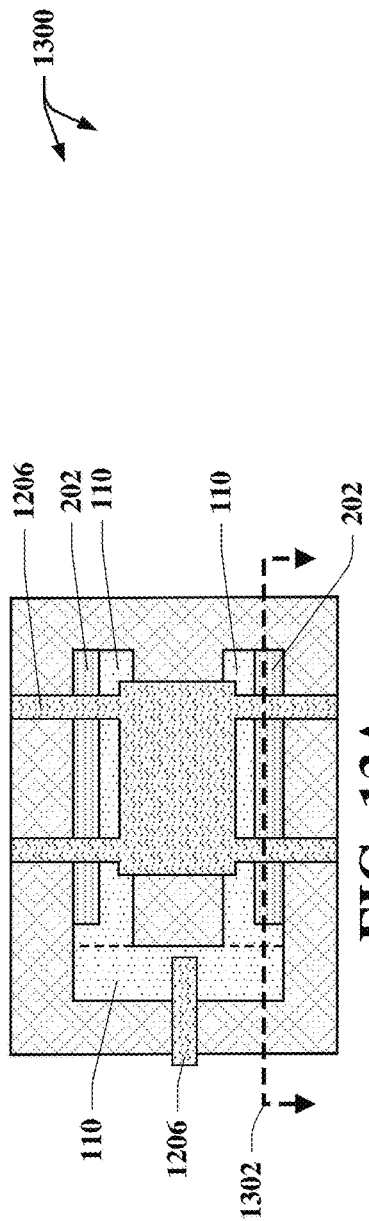
FIGS. 13A and 13B illustrate a top view and a cross-sectional view, respectively, of the example, non-limiting device of FIGS. 12A and 12B after removing the resist layer and/or the metal layer in accordance with one or more embodiments described herein.
Figure 13B:
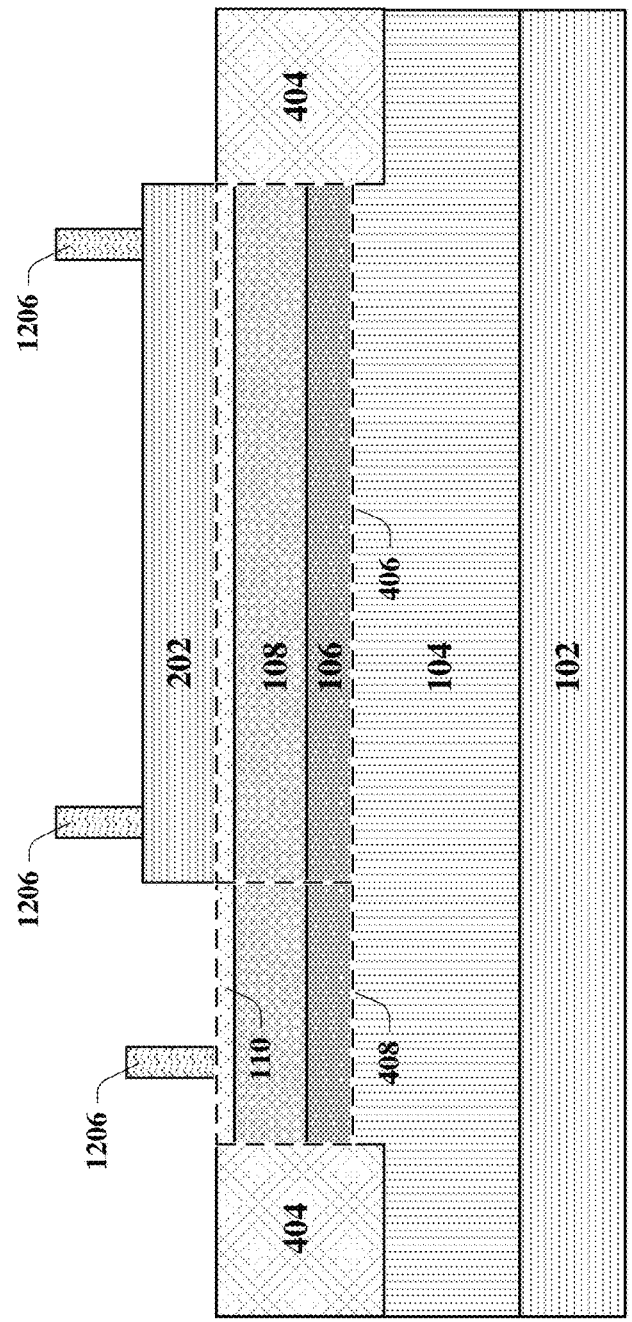

FIG. 13A illustrates a top view of a first side of the example, non-limiting device 1200 of FIGS. 12A and 12B after removing the resist layer and/or the metal layer in accordance with one or more embodiments described herein. In an example, the first side of device 1200 can comprise a first side of device 1300 illustrated in FIG. 13A, which can comprise a top side of device 1300. FIG. 13B illustrates a cross-sectional side view of device 1300 as viewed along a plane defined by line 1302. Repetitive description of like elements and/or processes employed in other embodiments described herein is omitted for sake of brevity.

Device 1300 can comprise an example, non-limiting alternative embodiment of device 1200 after washing device 1200 with a solvent to remove first resist layer 304 and/or metal layer 1204. For example, device 1300 can comprise an example, non-limiting alternative embodiment of device 1200 after washing device 1200 with an organic solvent to remove first resist layer 304 (e.g., the lift-off structure previously formed using first resist layer 304) and/or metal layer 1204. Removal of such layers can yield device 1300 comprising one or more wires 1206 coupled to a top surface of fourth III-V layer 110 (e.g., coupled to top surfaces of ion implant defined nanorods 406 and/or ion implant defined sensing region 408) as illustrated in FIGS. 13A and 13B.

Figure 14A:
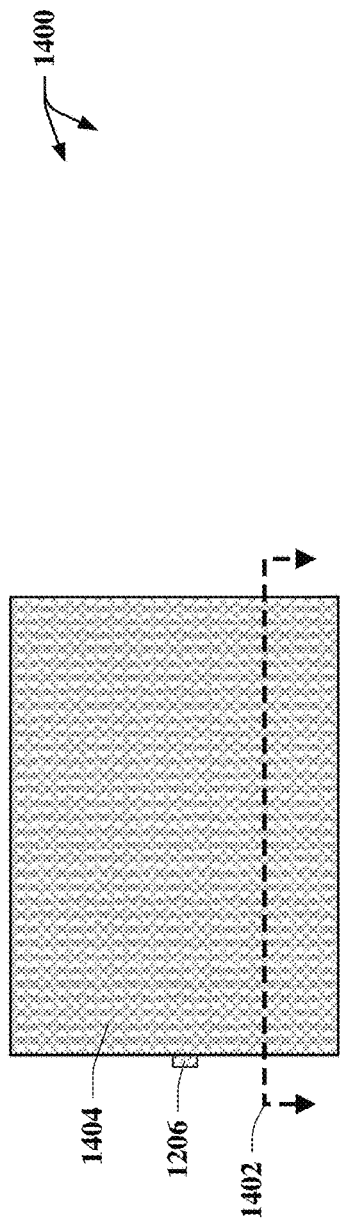
FIGS. 14A and 14B illustrate a top view and a cross-sectional view, respectively, of the example, non-limiting device of FIGS. 13A and 13B after forming an encapsulation film in accordance with one or more embodiments described herein.
Figure 14B:
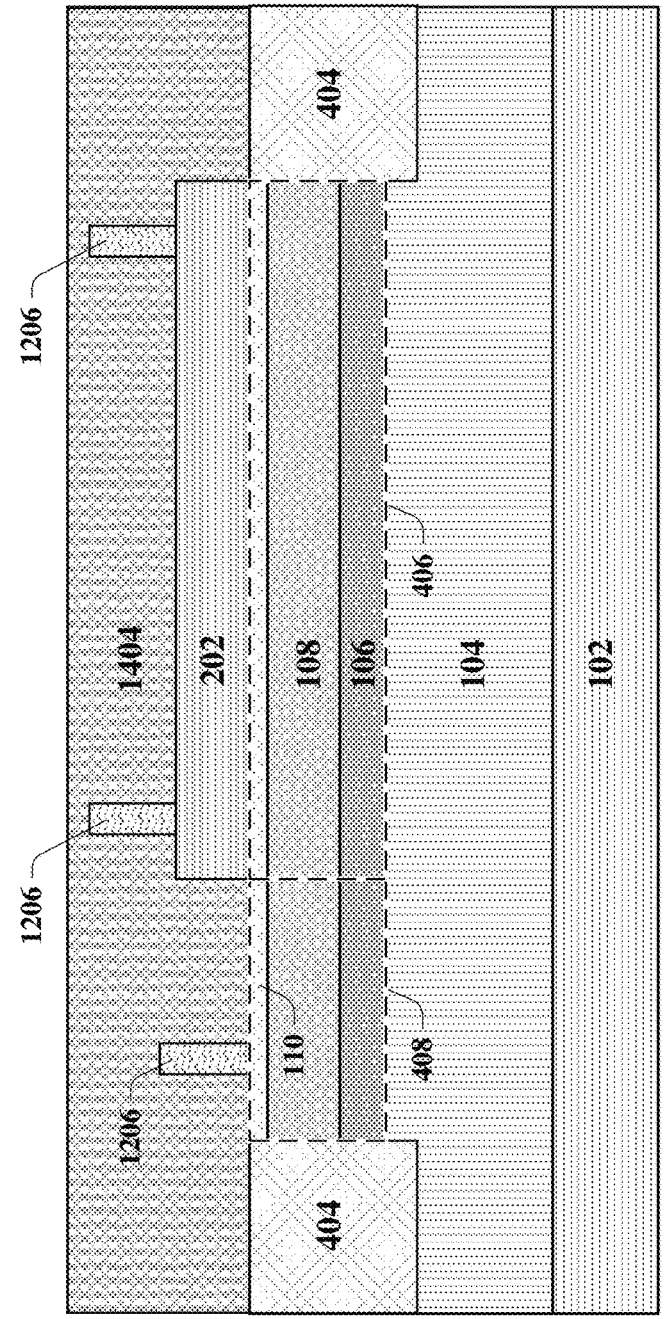

FIG. 14A illustrates a top view of a first side of the example, non-limiting device 1300 of FIGS. 13A and 13B after forming an encapsulation film in accordance with one or more embodiments described herein. In an example, the first side of device 1300 can comprise a first side of device 1400 illustrated in FIG. 14A, which can comprise a top side of device 1400. FIG. 14B illustrates a cross-sectional side view of device 1400 as viewed along a plane defined by line 1402. Repetitive description of like elements and/or processes employed in other embodiments described herein is omitted for sake of brevity.

Device 1400 can comprise an example, non-limiting alternative embodiment of device 1300 after formation of an encapsulation film 1404. In an example, encapsulation film 1404 can be formed on device 1300 using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). In another example, encapsulation film 1404 can be formed on device 1300 using an assembly process that enables packaging of an integrated circuit such as a semiconductor device (e.g., a packaging process, a sealing process, etc.).

Formation of encapsulation film 1404 on device 1300 can enable coupling of encapsulation film 1404 to one or more elements (e.g., layers, films, components, etc.) of device 1300. For example, formation of encapsulation film 1404 on device 1300 can enable coupling of encapsulation film 1404 to ion implanted region 404, which can be coupled to superconducting layer 202, ion implant defined nanorods 406, and/or ion implant defined sensing region 408 that can comprise components of a Majorana fermion device as described above. In this example, such formation of encapsulation film 1404 coupled to ion implanted region 404 can enable suspension of a Majorana fermion device in a quantum computing device. For instance, with reference to FIGS. 22A and 22B, such formation of encapsulation film 1404 coupled to ion implanted region 404 can enable suspension of Majorana fermion device 2206 in device 2200 after removal of a portion of encapsulation film 1404 as described below.

Formation of encapsulation film 1404 on device 1300 can enable flipping device 1400 to access a second side of device 1400. For example, formation of encapsulation film 1404 on device 1300 can enable flipping device 1400 to access a bottom side of device 1400 to form one or more additional contact gates (e.g., one or more wires 1206) on such a bottom side of device 1400 as described below.

Encapsulation film 1404 can comprise one or more materials including, but not limited to, germanium (Ge), silicon germanium (SiGe), oxide, tungsten oxide, silicon dioxide ($SiO_2$), gallium arsenide (GaAs), and/or another material. In an example (not illustrated in the figures), encapsulation film 1404 can comprise a multi-layer encapsulation film. For instance, encapsulation film 1404 can comprise an atomic layer deposition (ALD) film and an amorphous layer. In another example, encapsulation film 1404 can comprise one or more of the materials defined above and/or another material that can be formed on device 1300 to enable such flipping of device 1400 as described above and/or can further be removed using an aqueous solution.

Figure 15A:
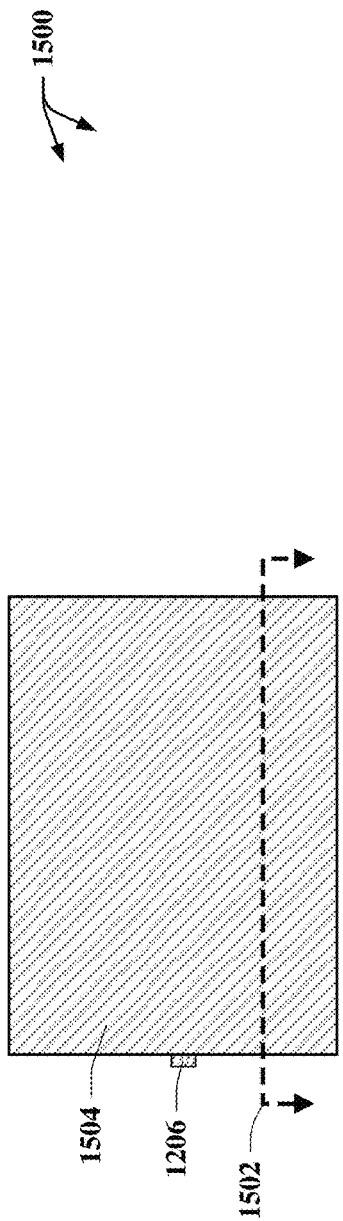
FIGS. 15A and 15B illustrate a top view and a cross-sectional view, respectively, of the example, non-limiting device of FIGS. 14A and 14B after bonding a second substrate layer to the encapsulation film in accordance with one or more embodiments described herein.
Figure 15B:
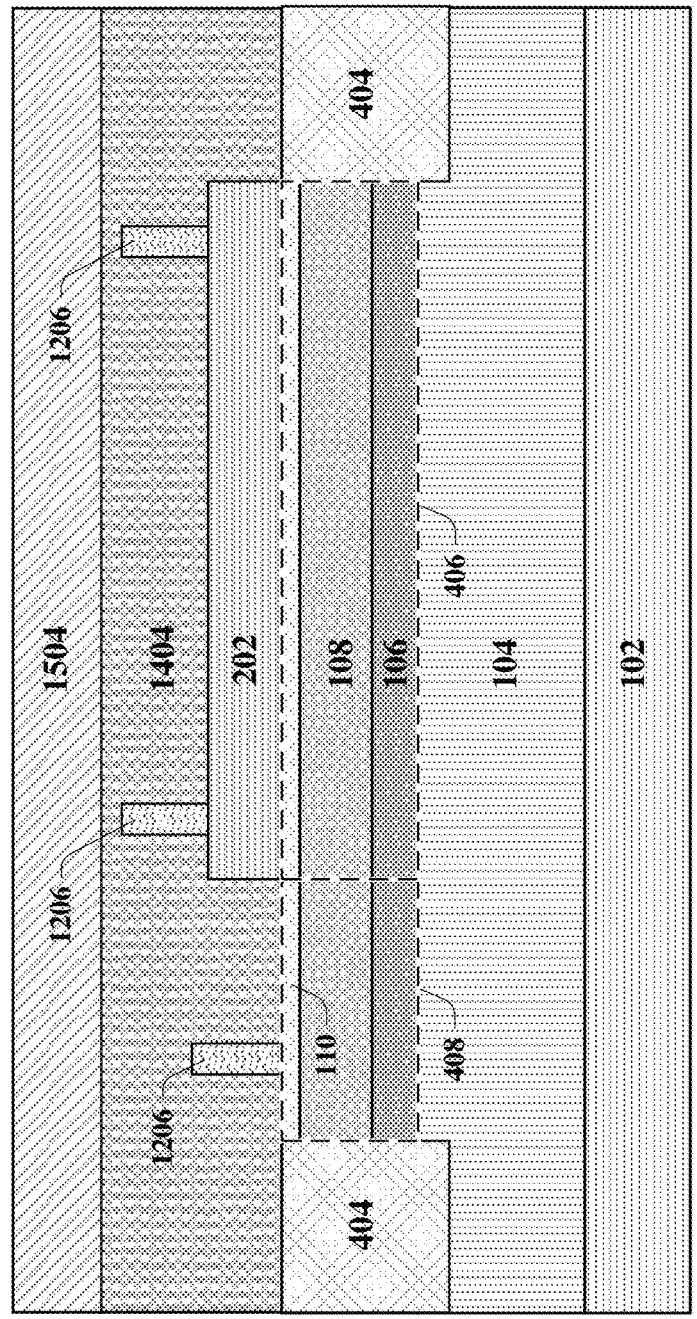

FIG. 15A illustrates a top view of a first side of the example, non-limiting device 1400 of FIGS. 14A and 14B after bonding a second substrate layer to the encapsulation film in accordance with one or more embodiments described herein. In an example, the first side of device 1400 can comprise a first side of device 1500 illustrated in FIG. 15A, which can comprise a top side of device 1500. FIG. 15B illustrates a cross-sectional side view of device 1500 as viewed along a plane defined by line 1502. Repetitive description of like elements and/or processes employed in other embodiments described herein is omitted for sake of brevity.

Device 1500 can comprise an example, non-limiting alternative embodiment of device 1400 after planarization of encapsulation film 1404 and/or bonding of a second substrate layer 1504 to encapsulation film 1404. For example, device 1500 can comprise an example, non-limiting alternative embodiment of device 1400 after performing chemical-mechanical planarization (CMP) to planarize encapsulation film 1404 and/or bonding of second substrate layer 1504 to encapsulation film 1404 using a wafer bonding process (e.g., direct bonding, plasma-activated bonding, anodic bonding, eutectic bonding, glass frit bonding, adhesive bonding, thermocompression bonding, transient liquid phase diffusion bonding, surface activated bonding, etc.).

In an embodiment, second substrate layer 1504 can comprise one or more of the same materials as substrate layer 102 defined above (e.g., Si, $Al_2O_3$, SiGe, SiGeC, SiC, Ge alloys, III/V compound semiconductors, II/VI compound semiconductors, etc.). Second substrate layer 1504 can comprise a thickness ranging from approximately 200 μm to approximately 750 μm.

Figure 16A:
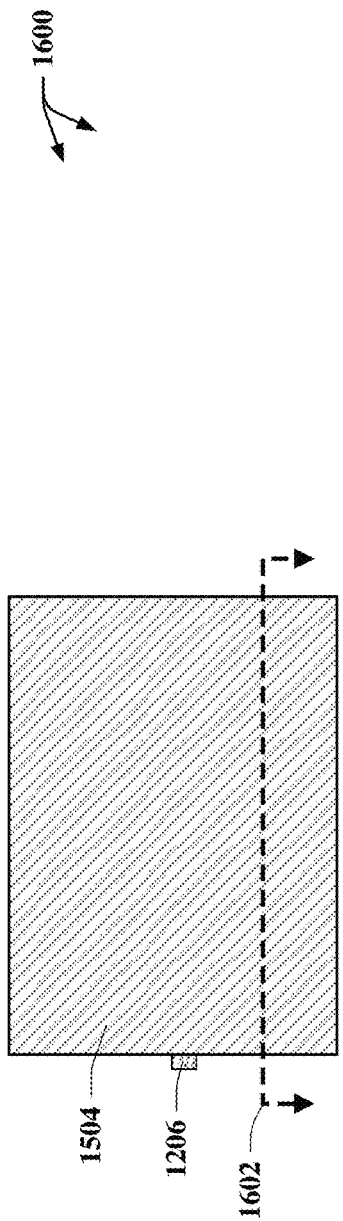
FIGS. 16A and 16B illustrate a top view and a cross-sectional view, respectively, of the example, non-limiting device of FIGS. 15A and 15B after removing the substrate layer in accordance with one or more embodiments described herein.
Figure 16B:
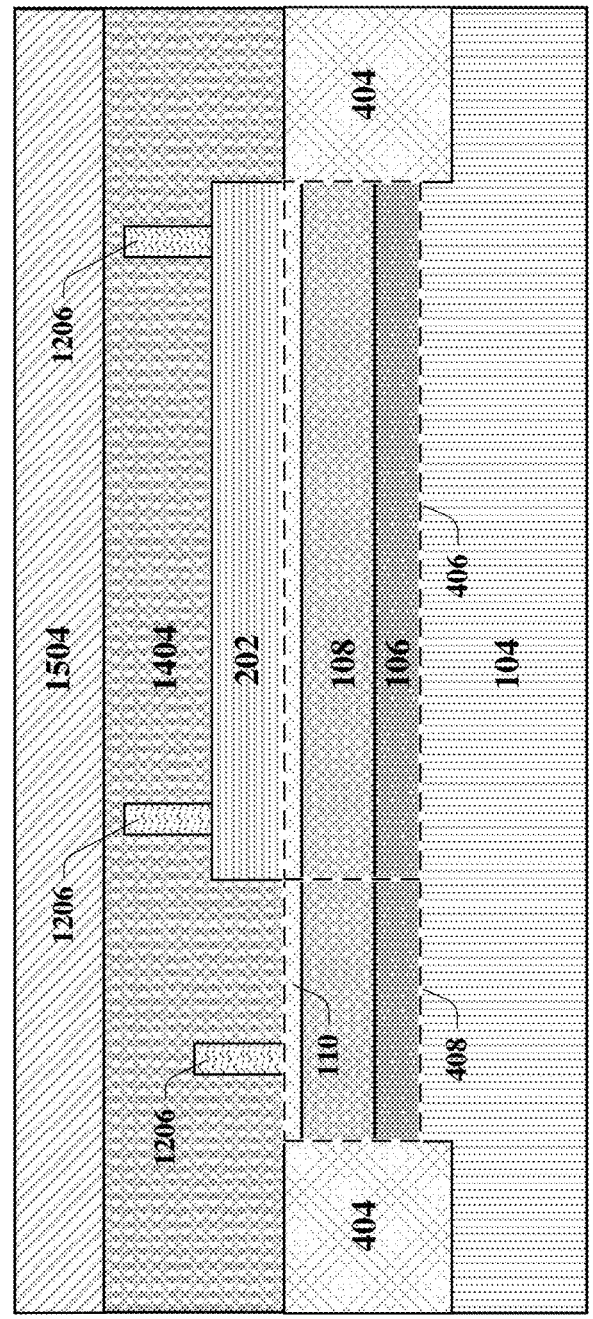

FIG. 16A illustrates a top view of a first side of the example, non-limiting device 1500 of FIGS. 15A and 15B after removing the substrate layer in accordance with one or more embodiments described herein. In an example, the first side of device 1500 can comprise a first side of device 1600 illustrated in FIG. 16A, which can comprise a top side of device 1600. FIG. 16B illustrates a cross-sectional side view of device 1600 as viewed along a plane defined by line 1602. Repetitive description of like elements and/or processes employed in other embodiments described herein is omitted for sake of brevity.

Device 1600 can comprise an example, non-limiting alternative embodiment of device 1500 after removal of substrate layer 102. For example, device 1600 can comprise an example, non-limiting alternative embodiment of device 1500 after separation of substrate layer 102 from first III-V layer 104 using one or more material removal techniques defined above (e.g., CMP, etching, backgrinding, etc.).

Figure 17A:
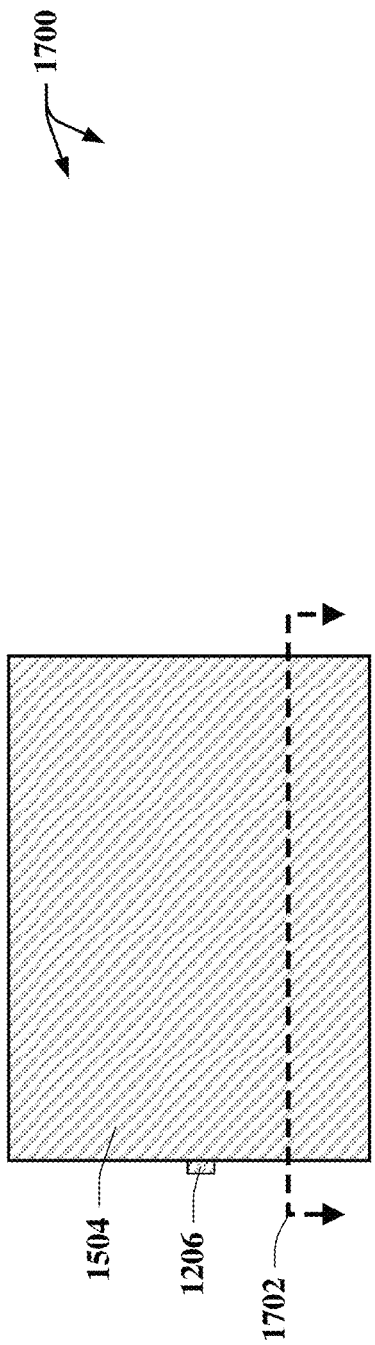
FIGS. 17A and 17B illustrate a top view and a cross-sectional view, respectively, of the example, non-limiting device of FIGS. 16A and 16B after removing a semiconducting layer in accordance with one or more embodiments described herein.
Figure 17B:
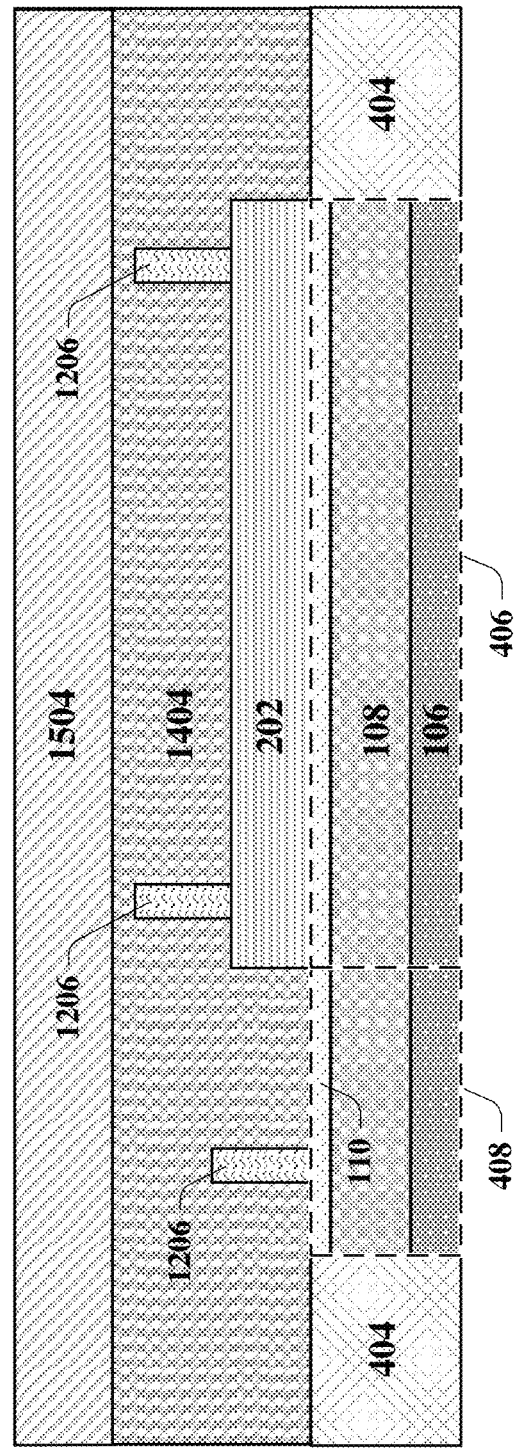

FIG. 17A illustrates a top view of a first side of the example, non-limiting device 1600 of FIGS. 16A and 16B after removing a semiconducting layer in accordance with one or more embodiments described herein. In an example, the first side of device 1600 can comprise a first side of device 1700 illustrated in FIG. 17A, which can comprise a top side of device 1700. FIG. 17B illustrates a cross-sectional side view of device 1700 as viewed along a plane defined by line 1702. Repetitive description of like elements and/or processes employed in other embodiments described herein is omitted for sake of brevity.

Device 1700 can comprise an example, non-limiting alternative embodiment of device 1600 after removal of first III-V layer 104. For example, device 1700 can comprise an example, non-limiting alternative embodiment of device 1600 after removal of first III-V layer 104 from second III-V layer 106 using one or more material removal techniques defined above (e.g., CMP, etching, backgrinding, etc.).

Figure 18A:
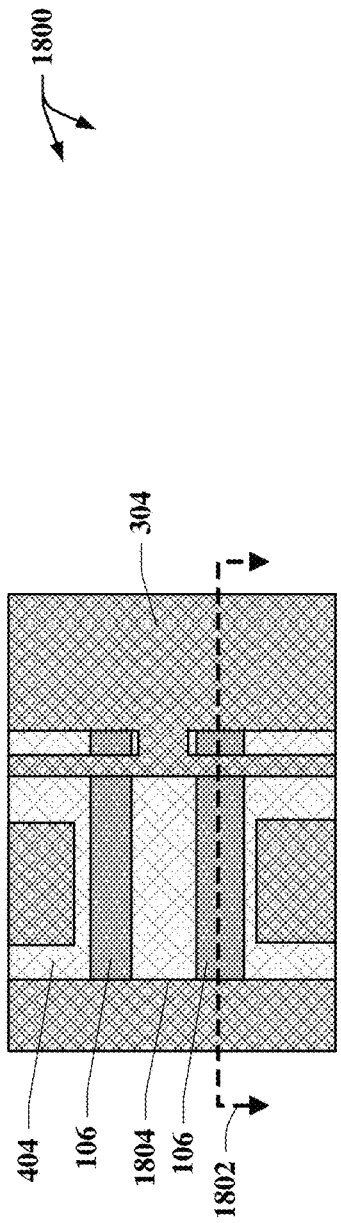
FIGS. 18A and 18B illustrate a top view and a cross-sectional view, respectively, of the example, non-limiting device of FIGS. 17A and 17B after rotation and forming a resist layer in accordance with one or more embodiments described herein.
Figure 18B:
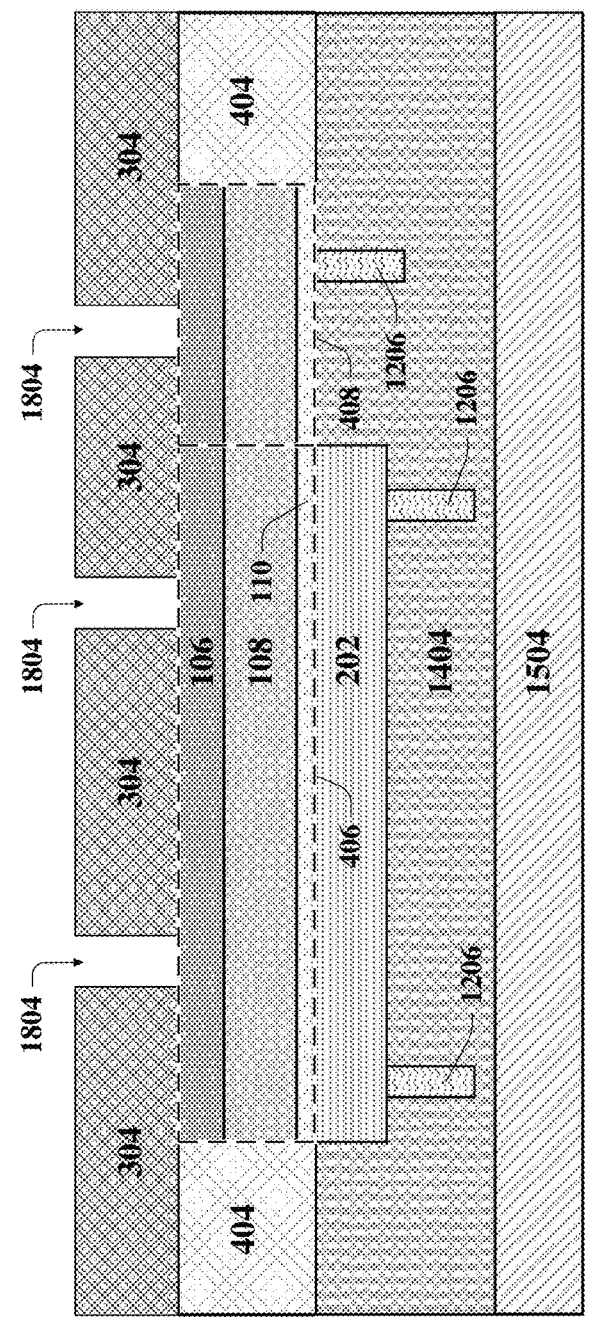

FIG. 18A illustrates a top view of a second side of the example, non-limiting device 1700 of FIGS. 17A and 17B after rotation and forming a resist layer in accordance with one or more embodiments described herein. In an example, the second side of device 1700 can comprise a second side of device 1800 illustrated in FIG. 18A, which can comprise a bottom side of device 1800. FIG. 18B illustrates a cross-sectional side view of device 1800 as viewed along a plane defined by line 1802. Repetitive description of like elements and/or processes employed in other embodiments described herein is omitted for sake of brevity.

Device 1800 can comprise an example, non-limiting alternative embodiment of device 1700 after flipping device 1700 (e.g., rotating it 180 degrees about an axis that is perpendicular to the page) and forming a resist layer that can comprise first resist layer 304 on portions of device 1700 as illustrated in FIGS. 18A and 18B. First resist layer 304 can comprise one or more of the photoresist materials defined above that can be formed using one or more photolithography, patterning, and/or photoresist techniques defined above (e.g., a lithographic patterning process). First resist layer 304 can comprise a pattern resist that can be used to pattern one or more openings 1804, for instance, as illustrated in FIGS. 18A and 18B that define areas of device 1800 onto which one or more contact gates (e.g., electrical contacts) and/or, in some embodiments, an expanded electrode layer can be coupled (e.g., communicatively, electrically, operatively, optically, physically, etc.). For example, first resist layer 304 can comprise a pattern resist that can be used to pattern one or more openings 1804, for instance, as illustrated in FIGS. 18A and 18B that define areas on one or more surfaces (e.g., bottom surfaces) of ion implant defined nanorods 406 and/or ion implant defined sensing region 408 onto which one or more contact gates and/or, in some embodiments an expanded electrode layer, can be coupled. In an example, first resist layer 304 can comprise a lift-off structure having an undercut profile, where metal can be evaporated onto such a lift-off structure to enable formation of the one or more contact gates described above.

FIG. 19A illustrates a top view of a second side of the example, non-limiting device 1800 of FIGS. 18A and 18B after depositing a metal layer to form one or more wires in accordance with one or more embodiments described herein. In an example, the second side of device 1800 can comprise a second side of device 1900 illustrated in FIG. 19A, which can comprise a bottom side of device 1900. FIG. 19B illustrates a cross-sectional side view of device 1900 as viewed along a plane defined by line 1902. Repetitive description of like elements and/or processes employed in other embodiments described herein is omitted for sake of brevity.

Device 1900 can comprise an example, non-limiting alternative embodiment of device 1800 after: cleaning surfaces (e.g., bottom surfaces) of second III-V layer 106; depositing metal layer 1204 onto device 1800; and/or washing device 1800 with a solvent, thereby forming one or more wires 1206 coupled to one or more surfaces of device 1800 (e.g., in addition to the one or more wires 1206 formed on device 1200 as described above) and/or, in some embodiments, an expanded electrode layer 1904 coupled to such one or more surfaces of device 1800 (e.g., formation of expanded electrode layer 1904 on device 1900 can be optional). As formation of expanded electrode layer 1904 on device 1900 can be optional, for purposes of clarity it is not illustrated in FIG. 19B. In an example, device 1900 can comprise a non-limiting alternative embodiment of device 1800 after: cleaning bottom surfaces of second III-V layer 106; depositing metal layer 1204 onto the bottom surfaces of second III-V layer 106 (e.g., bottom surfaces of ion implant defined nanorods 406 and/or ion implant defined sensing region 408) using a metal evaporation process; and/or washing device 1800 with an organic solvent to form one or more wires 1206 and/or, in some embodiments, expanded electrode layer 1904 coupled to the bottom surfaces of second III-V layer 106 (e.g., bottom surfaces of ion implant defined nanorods 406 and/or ion implant defined sensing region 408).

As described above, metal layer 1204 and/or one or more wires 1206 can comprise electrically conductive components through which electrical current (e.g., alternating current and/or direct current), electrical signals (e.g., microwave frequency signals, etc.), and/or optical signals can flow. Metal layer 1204 and/or one or more wires 1206 can be deposited (e.g., via a metal evaporation process) onto first resist layer 304 and/or second III-V layer 106 of device 1100 using one or more materials, including but not limited to, aluminum (Al), copper, copper alloys (e.g., copper nickel), gold, platinum, palladium, gold alloys (e.g., gold palladium), brass, and/or any other electrically conductive metal or alloy. In an example, one or more wires 1206 can comprise one or more electrically conductive components including, but not limited to, a control wire, a tunnel junction gate, a pinch gate, a chemical potential control gate, a sensing wire, a semiconductor connector, an electrode, a circuit wire, a contact, and/or another electrically conductive component. Metal layer 1204 can be formed such that wire(s) 1206 can comprise a thickness (e.g., height) ranging from approximately 5 nm to approximately 100 nm and/or a width ranging from approximately 5 nm to approximately 50 nm. In an embodiment, metal layer 1204 can be formed such that wire(s) 1206 can comprise a thickness (e.g., height) ranging from 20 nm to 50 nm.

In embodiments where expanded electrode layer 1904 is coupled to one or more surfaces (e.g., bottom surfaces) of second III-V layer 106 (e.g., bottom surfaces of ion implant defined nanorods 406 and/or ion implant defined sensing region 408), expanded electrode layer 1904 can comprise a quasiparticle gettering structure that can repel undesired quasiparticles from one or more components of device 1900 (e.g., ion implant defined nanorods 406, ion implant defined sensing region 408, Majorana fermion device 2206, etc.). For example, expanded electrode layer 1904 can comprise a quasiparticle gettering structure that can enable application of an electrical charge on ion implant defined nanorods 406, where such an electrical charge can serve as a barrier to repel quasiparticle electrons that can be in proximity to ion implant defined nanorods 406 and/or ion implant defined sensing region 408. Expanded electrode layer 1904 can thereby facilitate reduced defects and/or improved longevity of ion implant defined nanorods 406 and/or ion implant defined sensing region 408 by preventing the quasiparticle electrons from migrating to ion implant defined nanorods 406 and/or ion implant defined sensing region 408 and quenching the Majorana fermion, which can destroy its coherence. As expanded electrode layer 1904 is optional, it is depicted in FIG. 19A for illustration purposes only and it is to be understood that the subject disclosure in accordance with one or more of the embodiments described herein is not so limiting.

In embodiments where expanded electrode layer 1904 is coupled to one or more surfaces (e.g., bottom surfaces) of second III-V layer 106 (e.g., bottom surfaces of ion implant defined nanorods 406 and/or ion implant defined sensing region 408) as described above, expanded electrode layer 1904 can comprise the same type of electrically conductive component(s) and/or the same material(s) used to form metal layer 1204 and/or wires 1206. In an example, expanded electrode layer 1904 can be formed at the same time as metal layer 1204 and/or wires 1206 and/or using the same metal deposition process used to form metal layer 1204 and/or wires 1206 as described above. In another example, expanded electrode layer 1904 can be formed at a different time than metal layer 1204 and/or wires 1206, using a different metal deposition process than that used to form metal layer 1204 and/or wires 1206 as described above, and/or using different materials than the those described above that can be used to form metal layer 1204 and/or wires 1206. In some embodiments, expanded electrode layer 1904 can comprise a width ranging from approximately 300 nm to approximately 5,000 nm and/or a length ranging from approximately 300 nm to approximately 5,000 nm.

FIG. 20A illustrates a top view of a second side of the example, non-limiting device 1900 of FIGS. 19A and 19B after removing the resist layer and metal layer in accordance with one or more embodiments described herein. In an example, the second side of device 1900 can comprise a second side of device 2000 illustrated in FIG. 20A, which can comprise a bottom side of device 2000. FIG. 20B illustrates a cross-sectional side view of device 2000 as viewed along a plane defined by line 2002. Repetitive description of like elements and/or processes employed in other embodiments described herein is omitted for sake of brevity. As expanded electrode layer 1904 is optional, it is depicted in FIGS. 20A and 20B for illustration purposes only and it is to be understood that the subject disclosure in accordance with one or more of the embodiments described herein is not so limiting.

Device 2000 can comprise an example, non-limiting alternative embodiment of device 1900 after washing device 1900 with a solvent to remove first resist layer 304 and/or metal layer 1204. For example, device 2000 can comprise an example, non-limiting alternative embodiment of device 1900 after washing device 1900 with an organic solvent to remove first resist layer 304 (e.g., the lift-off structure previously formed using first resist layer 304) and/or metal layer 1204. Removal of such layers can yield device 2000 comprising one or more wires 1206 and/or in some embodiments, expanded electrode layer 1904 coupled to a top surface of fourth III-V layer 110 (e.g., coupled to top surfaces of ion implant defined nanorods 406 and/or ion implant defined sensing region 408).

In some embodiments, one or more wires 1206 can comprise wires 1206a, 1206b that can be coupled to second III-V layer 106 and/or to fourth III-V layer 110 (e.g., coupled to top and/or bottom surfaces of ion implant defined nanorods 406 and/or ion implant defined sensing region 408) as illustrated in FIGS. 20A and 20B. Wires 1206a, 1206b can comprise control wiring structures (e.g., electrodes). For example, wires 1206a can comprise chemical potential control electrodes that can enable application of a voltage on the wires 1206a to alter the energy of ion implant defined nanorods 406 to a zero-energy state to form a Majorana fermion (e.g., to facilitate observation of Majorana fermion characteristic(s), behavior(s), etc.). In another example, wires 1206b can comprise pinch gates that allow such Majorana fermions to interact with the quantum structure (e.g., a quantum well of device 2000 comprise quantum dots, ion implant defined sensing region 408, etc.). For instance, changing the voltage of the pinch gate allows current to flow through one or more components of device 2000 (e.g., second III-V layer 106, third III-V layer 108, fourth III-V layer 110, superconducting layer 202, ion implant defined nanorods 406, ion implant defined sensing region 408, etc.) and enables sensing of the Majorana fermion structure (e.g., facilitates observation of Majorana fermion characteristic(s), behavior(s), etc.).

Figure 21A:
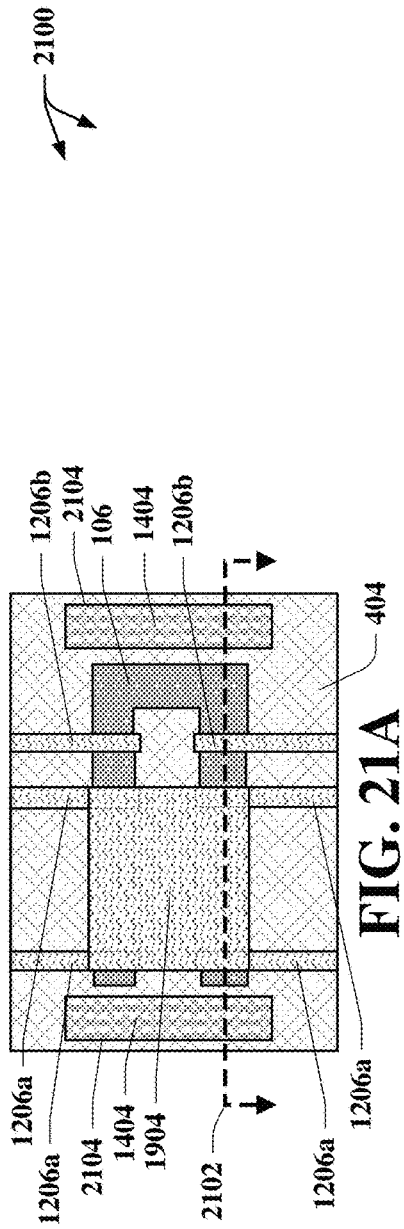
FIGS. 21A and 21B illustrate a top view and a cross-sectional view, respectively, of the example, non-limiting device of FIGS. 20A and 20B after removal of one or more portions of the ion implanted region from the encapsulation film to form one or more openings in accordance with one or more embodiments described herein.
Figure 21B:
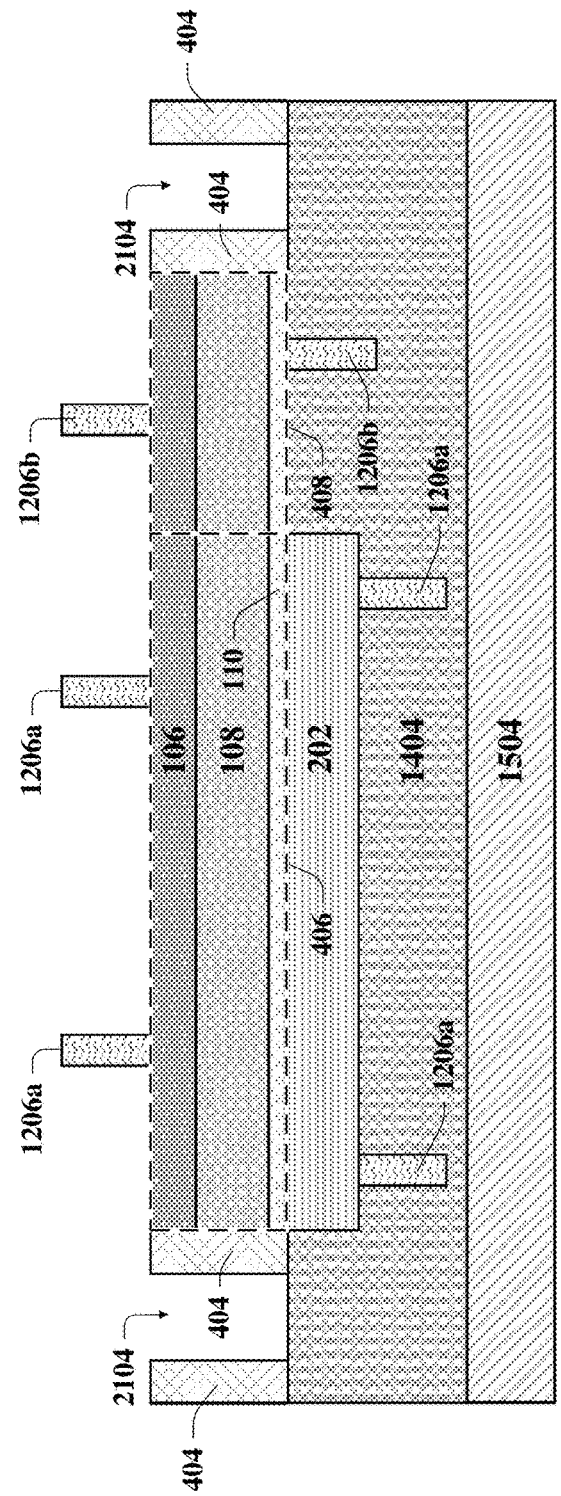

FIG. 21A illustrates a top view of a second side of the example, non-limiting device 2000 of FIGS. 20A and 20B after removal of one or more portions of the ion implanted region from the encapsulation film to form one or more openings in accordance with one or more embodiments described herein. In an example, the second side of device 2000 can comprise a second side of device 2100 illustrated in FIG. 21A, which can comprise a bottom side of device 2100. FIG. 21B illustrates a cross-sectional side view of device 2100 as viewed along a plane defined by line 2102. Repetitive description of like elements and/or processes employed in other embodiments described herein is omitted for sake of brevity.

As expanded electrode layer 1904 is optional, it is depicted in FIG. 21A for illustration purposes only and it is to be understood that the subject disclosure in accordance with one or more of the embodiments described herein is not so limiting. For purposes of clarity, expanded electrode layer 1904 is not illustrated in FIG. 21B.

Device 2100 can comprise an example, non-limiting alternative embodiment of device 2000 after removal of one or more portions of ion implanted region 404 from encapsulation film 1404 to form one or more openings 2104 as illustrated in FIGS. 21A and 21B. For example, device 2100 can comprise an example, non-limiting alternative embodiment of device 2000 after formation of a pattern resist (e.g., first resist layer 304 using one or more lithography techniques described above) on a surface of ion implanted region 404 and/or removing such one or more portions of ion implanted region 404 from encapsulation film 1404 to form one or more openings 2104 (e.g., using one or more material removal techniques described above (e.g., CMP, etching, etc.). In this example, formation of such opening(s) 2104 can expose a surface of encapsulation film 1404 to enable removal of one or more portions of encapsulation film 1404 as described below.

FIG. 22A illustrates a top view of a second side of the example, non-limiting device 2100 of FIGS. 21A and 21B after removal of one or more portions of the encapsulation film to form one or more hollow spaces and a suspended Majorana fermion device in accordance with one or more embodiments described herein. In an example, the second side of device 2100 can comprise a second side of device 2200 illustrated in FIG. 22A, which can comprise a bottom side of device 2200. FIG. 22B illustrates a cross-sectional side view of device 2200 as viewed along a plane defined by line 2202. Repetitive description of like elements and/or processes employed in other embodiments described herein is omitted for sake of brevity.

As expanded electrode layer 1904 is optional, it is depicted in FIG. 22A for illustration purposes only and it is to be understood that the subject disclosure in accordance with one or more of the embodiments described herein is not so limiting. For purposes of clarity, expanded electrode layer 1904 is not illustrated in FIG. 22B.

Device 2200 can comprise an example, non-limiting alternative embodiment of device 2100 after removal of one or more portions of encapsulation film 1404 from device 2100 to form one or more hollow spaces 2204 as illustrated in FIGS. 22A and 22B. For example, device 2200 can comprise an example, non-limiting alternative embodiment of device 2100 after removal of such one or more portions of encapsulation film 1404 from device 2100 using, for instance, a wet etch process (e.g., using a mild wet etch solution such as, for instance, water, organic solvent, etc.), a plasma process (e.g., mild plasma material removal), and/or another material removal technique.

As encapsulation film 1404 is depicted in FIGS. 21A and 21B as being directly coupled to superconducting layer 202, ion implant defined nanorods 406, and/or ion implant defined sensing region 408, and as encapsulation film 1404 can comprise an amorphous and/or dielectric film as described above, it can have defects that can cause quenching of a Majorana fermion(s) that can form in device 2100. Therefore, removal of encapsulation film 1404 can prevent such direct coupling and thereby prevent quenching of such Majorana fermion(s) that can form in device 2100.

In an embodiment, device 2200 can comprise a quantum computing device (e.g., quantum circuit, quantum hardware, quantum processor, quantum computer, etc.) comprising a Majorana fermion device 2206 depicted as bold dashed lines in FIGS. 22A and 22B. Removal of such portion(s) of encapsulation film 1404 to form hollow space(s) 2204 as described above can thereby expose one or more sides of Majorana fermion device 2206 to hollow space(s) 2204 of device 2200. For example, Majorana fermion device 2206 can comprise portions of second III-V layer 106, third III-V layer 108, fourth III-V layer 110, superconducting layer 202, ion implant defined nanorods 406, and/or ion implant defined sensing region 408 as illustrated by the bold dashed lines depicted in FIGS. 22A and 22B. In this example, one or more surfaces of one or more of such elements can comprise one or more sides of Majorana fermion device 2206 that can be exposed to hollow space(s) 2204. For instance, as illustrated in FIG. 22B, one or more surfaces of fourth III-V layer 110, superconducting layer 202, ion implant defined nanorods 406, and/or ion implant defined sensing region 408 of Majorana fermion device 2206 can comprise such one or more sides of Majorana fermion device 2206 that can be exposed to hollow space(s) 2204.

In another example (not illustrated in the figures), one or more surfaces second III-V layer 106, ion implant defined nanorods 406, and/or ion implant defined sensing region 408 of Majorana fermion device 2206 can comprise such one or more sides of Majorana fermion device 2206 that can be exposed to a hollow space 2204 that can be positioned above second III-V layer 106 (e.g., positioned "above" second III-V layer 106 with respect to layout of the elements depicted in FIG. 22B). In one or more of the examples described above, such formation of hollow space(s) 2204 above and/or below Majorana fermion device 2206 can enable suspension of Majorana fermion device 2206 in device 2200 (e.g., "above" and/or "below" with respect to layout of the elements depicted in FIG. 22B). For instance, portions of ion implanted region 404 can remain coupled to Majorana fermion device 2206 after formation of opening(s) 2104 as depicted in FIGS. 21A, 21B, 22A, and 22B. Such remaining portions of ion implanted region 404 can be further coupled to portions of encapsulation film 1404 remaining after formation of hollow space(s) 2204 above and/or below Majorana fermion device 2206 as depicted in FIGS. 22A and 22B (e.g., "above" and/or "below" with respect to layout of the elements depicted in FIG. 22B). Such remaining portions of encapsulation film 1404 can also remain coupled to second substrate layer 1504 after formation of hollow space(s) 2204 above and/or below Majorana fermion device 2206 as depicted in FIGS. 22A and 22B (e.g., "above" and/or "below" with respect to layout of the elements depicted in FIG. 22B). Such remaining portions of ion implanted region 404 and/or encapsulation film 1404 remaining after formation of opening(s) 2104 and/or hollow space(s) 2204, respectively, can provide physical (e.g., mechanical) support of Majorana fermion device 2206 to enable suspension of Majorana fermion device 2206 above and/or below hollow space(s) 2204 in device 2200 as depicted in FIGS. 22A and 22B (e.g., "above" and/or "below" with respect to layout of the elements depicted in FIG. 22B).

In another example, as depicted in FIGS. 22A and 22B, one or more wires 1206a, 1206b can be coupled to such one or more sides of Majorana fermion device 2206 described above that can be exposed to hollow space(s) 2204 of device 2200. In this example, such wire(s) 1206a, 1206b can be coupled to such side(s) of Majorana fermion device 2206 in hollow space(s) 2204 of device 2200. As described below with reference to FIG. 24, wire(s) 1206a, 1206b can be further coupled to one or more electrically conductive components of support region(s) 2402 on device 2400, where device 2400 can comprise a quantum computing device.

As described above, in some embodiments, formation of expanded electrode layer 1904 can be optional. In an embodiment where expanded electrode layer 1904 is formed in device 2200, it can be coupled to one or more surfaces (e.g., bottom surfaces) of second III-V layer 106 (e.g., bottom surfaces of ion implant defined nanorods 406) as illustrated in FIG. 22A. In another embodiment (not illustrated in the figures), where expanded electrode layer 1904 is formed in device 2200, it can be coupled to one or more surfaces (e.g., top surfaces) of fourth III-V layer 110 (e.g., top surfaces of ion implant defined nanorods 406 and/or ion implant defined sensing region 408) and/or superconducting layer 202.

FIG. 23A illustrates a top view of a second side of the example, non-limiting device 2100 of FIGS. 21A and 21B after removal of one or more portions of the encapsulation film and deposition of one or more metal pads in accordance with one or more embodiments described herein. In an example, the second side of device 2100 can comprise a second side of device 2300 illustrated in FIG. 23A, which can comprise a bottom side of device 2300. FIG. 23B illustrates a cross-sectional side view of device 2300 as viewed along a plane defined by line 2302. Repetitive description of like elements and/or processes employed in other embodiments described herein is omitted for sake of brevity. As expanded electrode layer 1904 is optional, it is depicted in FIGS. 23A and 23B for illustration purposes only and it is to be understood that the subject disclosure in accordance with one or more of the embodiments described herein is not so limiting.

Device 2300 can comprise an example, non-limiting alternative embodiment of device 2100 after removal of one or more portions of encapsulation film 1404 from device 2100 and/or deposition of one or more metal pads 2304 that can comprise metal layer 1204 and/or metal wire(s) 1206. For example, device 2300 can comprise an example, non-limiting alternative embodiment of device 2100 after using opening(s) 2104 to remove such one or more portions of encapsulation film 1404 from device 2100 (e.g., wet etch using water, organic solvent, etc.) and depositing metal pad(s) 2304 using one or more material deposition techniques described above. In an embodiment (not illustrated in the figures), metal pad(s) 2304 can be formed such that they are coupled to wire(s) 1206 (e.g., wires 1206a,1206b). Metal pad(s) 2304 can comprise one or more of the materials defined above that can be used to form metal layer 1204 and/or wire(s) 1206.

Figure 24:
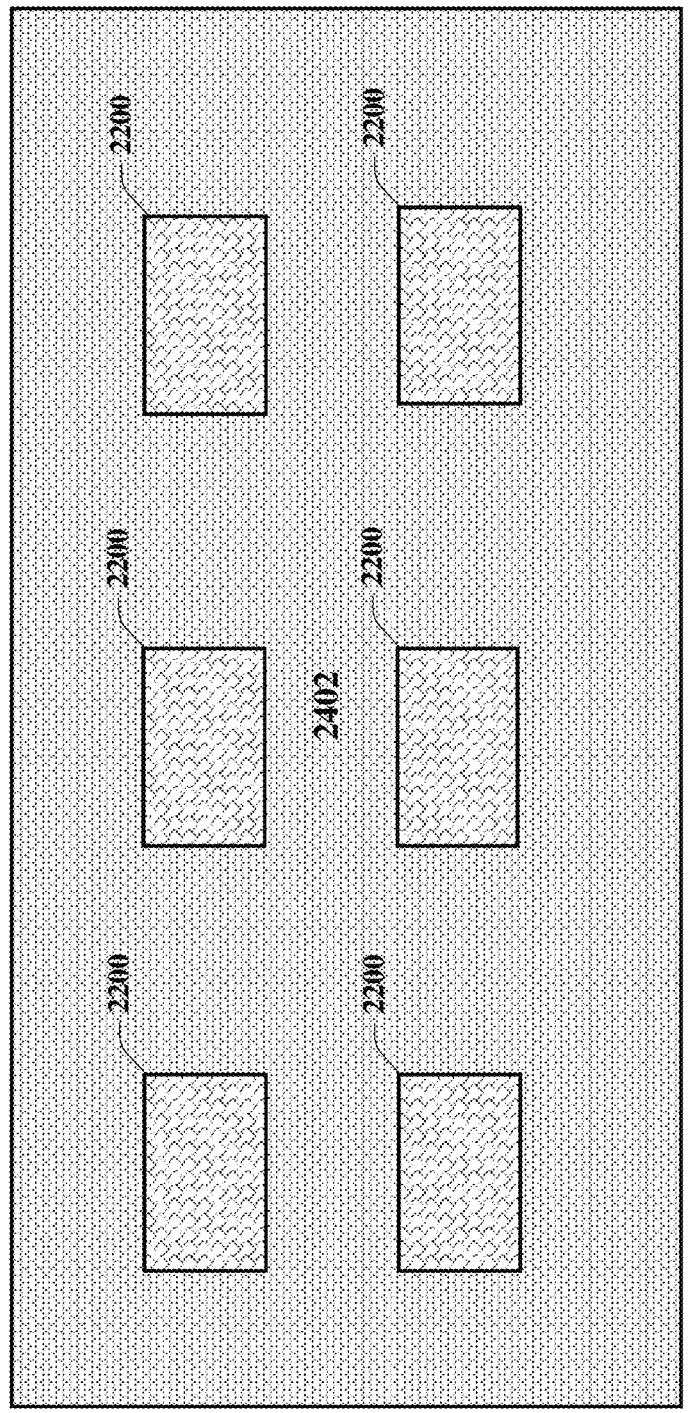
FIG. 24 illustrates a top view of an example, non-limiting device that can facilitate a suspended Majorana fermion device comprising an ion implant defined nanorod in a semiconducting device in accordance with one or more embodiments described herein.

FIG. 24 illustrates a top view of an example, non-limiting device 2400 that can facilitate a suspended Majorana fermion device comprising an ion implant defined nanorod in a semiconducting device in accordance with one or more embodiments described herein. Repetitive description of like elements and/or processes employed in other embodiments described herein is omitted for sake of brevity.

Device 2400 can comprise an example, non-limiting alternative embodiment of device 2200, where device 2400 can comprise a quantum computing device comprising multiple devices 2200 and/or one or more support regions 2402. For example, device 2400 can comprise multiple devices 2200 where each of such devices can comprise Majorana fermion device 2206 that can be suspended in hollow space(s) 2204 of device 2200 as described above. In this example, each of such devices 2200 can further comprise wire(s) 1206a, 1206b coupled to Majorana fermion device 2206 in hollow space(s) 2204 of device 2200.

The one or more support regions 2402 of device 2400 can comprise one or more support elements and/or one or more wiring structures of device 2400. For example, support region(s) 2402 can comprise portions of ion implanted region 404 and/or encapsulation film 1404 remaining after other portion(s) of such components have been removed to form hollow space(s) 2204 as described above. In another example, support region(s) 2402 can comprise one or more metallization layers having wire structures such as, for instance, electrically conductive components that can be coupled to wire(s) 1206a, 1206b, metal pad(s) 2304, and/or another component of device 2200 to facilitate execution of one or more operations of device 2200 in accordance with one or more embodiments of the subject disclosure described herein.

Device 2200 and/or Majorana fermion device 2206 can be associated with various technologies. For example, device 2200 and/or Majorana fermion device 2206 can be associated with semiconductor and/or superconductor device technologies, semiconductor and/or superconductor device fabrication technologies, quantum computing device technologies, quantum computing device fabrication technologies, Majorana fermion device technologies, Majorana fermion device fabrication technologies, and/or other technologies.

Device 2200 and/or Majorana fermion device 2206 can provide technical improvements to the various technologies listed above. For example, formation of Majorana fermion device 2206 comprising ion implant defined nanorods 406 that can be defined using an ion implantation process can prevent damaging the materials of device 2200 that can be caused by using other techniques (e.g., reactive-ion etching (RIE) and/or clean processes) to define circuit regions of a Majorana fermion device. For instance, such an ion implantation process can prevent damaging the regions of second III-V layer 106, third III-V layer 108, and/or fourth III-V layer 110 comprising ion implant defined nanorods 406 and/or ion implant defined sensing region 408. Such an ion implantation process can also prevent damage to superconducting layer 202.

In another example, using a substrate bonding process to place separate types of electrodes (e.g., wires 1206a, 1206b) above and below ion implant defined nanorods 406 and/or Majorana fermion device 2206 can facilitate an improved wiring layout of a semiconducting and/or superconducting device (e.g., device 2200) comprising Majorana fermion device 2206 and/or ion implant defined nanorods 406 by avoiding use of competing substrate regions. In another example, separating Majorana fermion device 2206 using a wafer (substrate) bonding technique to create a suspended Majorana fermion device in device 2200 having one or more sides exposed to hollow space(s) 2204 of device 2200 enables Majorana fermion device 2206 to avoid contact with a silicon wafer or dielectric film of device 2200. Such suspension has the advantage of minimizing contact with other films of device 2200 that can be a source of defects and further provides areas to form wiring patterns (e.g., wires 1206a, 1206b) on at least two sides (e.g., in at least two planes) of Majorana fermion device 2206.

In another example, device 2200 and/or Majorana fermion device 2206 can comprise one or more expanded electrode layer 1904, which can comprise a quasiparticle gettering structure that can enable application of an electrical charge on ion implant defined nanorods 406, where such an electrical charge can serve as a barrier to repel quasiparticle electrons that can be in proximity to ion implant defined nanorods 406 and/or ion implant defined sensing region 408. Device 2200 and/or Majorana fermion device 2206 comprising such an expanded electrode layer(s) 1904 can thereby facilitate reduced defects and/or improved longevity of ion implant defined nanorods 406 and/or ion implant defined sensing region 408 by preventing the quasiparticle electrons from migrating to ion implant defined nanorods 406 and/or ion implant defined sensing region 408 and quenching the Majorana fermion, which can destroy its coherence.

Device 2200 and/or Majorana fermion device 2206 can provide technical improvements to a processing unit associated with device 2200 and/or Majorana fermion device 2206. For example, based on the examples provided above describing fabrication of device 2200 and/or Majorana fermion device 2206 using methods and/or materials that protect the elements of such devices from defects and/or damage (e.g., ion implant defined nanorods 406, ion implant defined sensing region 408, expanded electrode layer 1208, suspension of Majorana fermion device 2206 in device 2200, etc.), device 2200 and/or Majorana fermion device 2206 can prevent quenching of Majorana fermions. Based on such prevention of Majorana fermion quenching, device 2200 and/or Majorana fermion device 2206 can enable improved (e.g., longer) coherence times of such Majorana fermions, thereby facilitating improved processing performance of a quantum computing device (e.g., a quantum processor) comprising device 2200 and/or Majorana fermion device 2206. Such improved processing performance of a quantum computing device (e.g., a quantum processor) comprising device 2200 and/or Majorana fermion device 2206 can further facilitate fast and/or possibly universal quantum computing.

Device 2200 and/or Majorana fermion device 2206 can be coupled to hardware and/or software to solve problems that are highly technical in nature, that are not abstract and that cannot be performed as a set of mental acts by a human. For example, device 2200 and/or Majorana fermion device 2206 can be employed in a semiconductor device (e.g., integrated circuit) used to implement a quantum computing device that can process information and/or execute calculations that are not abstract and that cannot be performed as a set of mental acts by a human.

It should be appreciated that device 2200 and/or Majorana fermion device 2206 can utilize various combinations of electrical components, mechanical components, and circuitry that cannot be replicated in the mind of a human or performed by a human. For example, facilitating a suspended Majorana fermion device comprising an ion implant defined nanorod in a semiconducting device can enable operation of a quantum computing device (e.g., a quntum processor of a quantum computing device) is an operation that is greater than the capability of a human mind. For instance, the amount of data processed, the speed of processing such data, and/or the types of data processed over a certain period of time by such a quantum computing device utilizing device 2200 and/or Majorana fermion device 2206 can be greater, faster, and/or different than the amount, speed, and/or data type that can be processed by a human mind over the same period of time.

According to several embodiments, device 2200 and/or Majorana fermion device 2206 can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that device 2200 and/or Majorana fermion device 2206 can include information that is impossible to obtain manually by an entity, such as a human user. For example, the type, amount, and/or variety of information included in device 2200 and/or Majorana fermion device 2206 can be more complex than information obtained manually by a human user.

Figure 25:
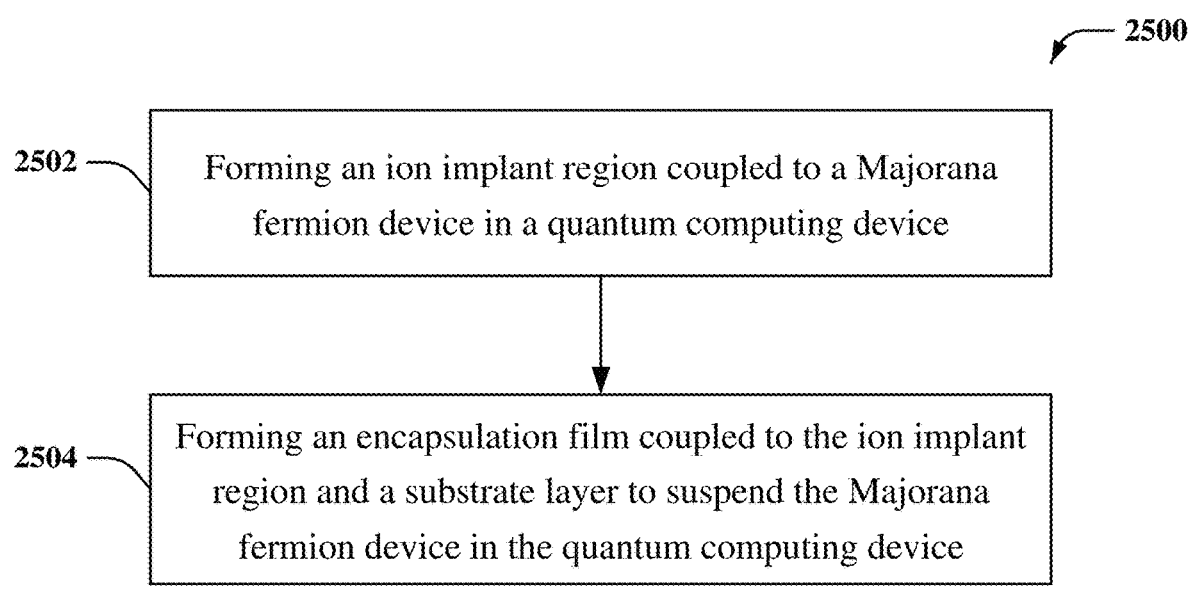
FIG. 25 illustrates a flow diagram of an example, non-limiting method that can facilitate implementing a suspended Majorana fermion device comprising an ion implant defined nanorod in a semiconducting device in accordance with one or more embodiments described herein.

FIG. 25 illustrates a flow diagram of an example, non-limiting method 2500 that can facilitate implementing a suspended Majorana fermion device comprising an ion implant defined nanorod in a semiconducting device in accordance with one or more embodiments described herein. Repetitive description of like elements and/or processes employed in other embodiments described herein is omitted for sake of brevity.

Method 2500 can be implemented by a computing system (e.g., operating environment 2600 illustrated in FIG. 26 and described below) and/or a computing device (e.g., computer 2612 illustrated in FIG. 26 and described below). In non-limiting example embodiments, such computing system (e.g., operating environment 2600) and/or such computing device (e.g., computer 2612) can comprise one or more processors and one or more memory devices that can store executable instructions thereon that, when executed by the one or more processors, can facilitate performance of the operations described herein, including the non-limiting operations of method 2500 illustrated in FIG. 25. As a non-limiting example, the one or more processors can facilitate performance of the operations described herein, for example, method 2500, by directing and/or controlling one or more systems and/or equipment operable to perform semiconductor fabrication.

At 2502, method 2500 can comprise forming (e.g., via computer 2612) an ion implanted region (e.g., ion implanted region 404) coupled to a Majorana fermion device (e.g., Majorana fermion device 2206) in a quantum computing device (e.g., device 220, device 2400, etc.).

At 2504, method 2500 can comprise forming (e.g., via computer 2612) an encapsulation film (e.g., encapsulation film 1404) coupled to the ion implanted region and a substrate layer (e.g., second substrate layer 1504) to suspend the Majorana fermion device in the quantum computing device (e.g., as described above with reference to FIGS. 22A and 22B).

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 26:
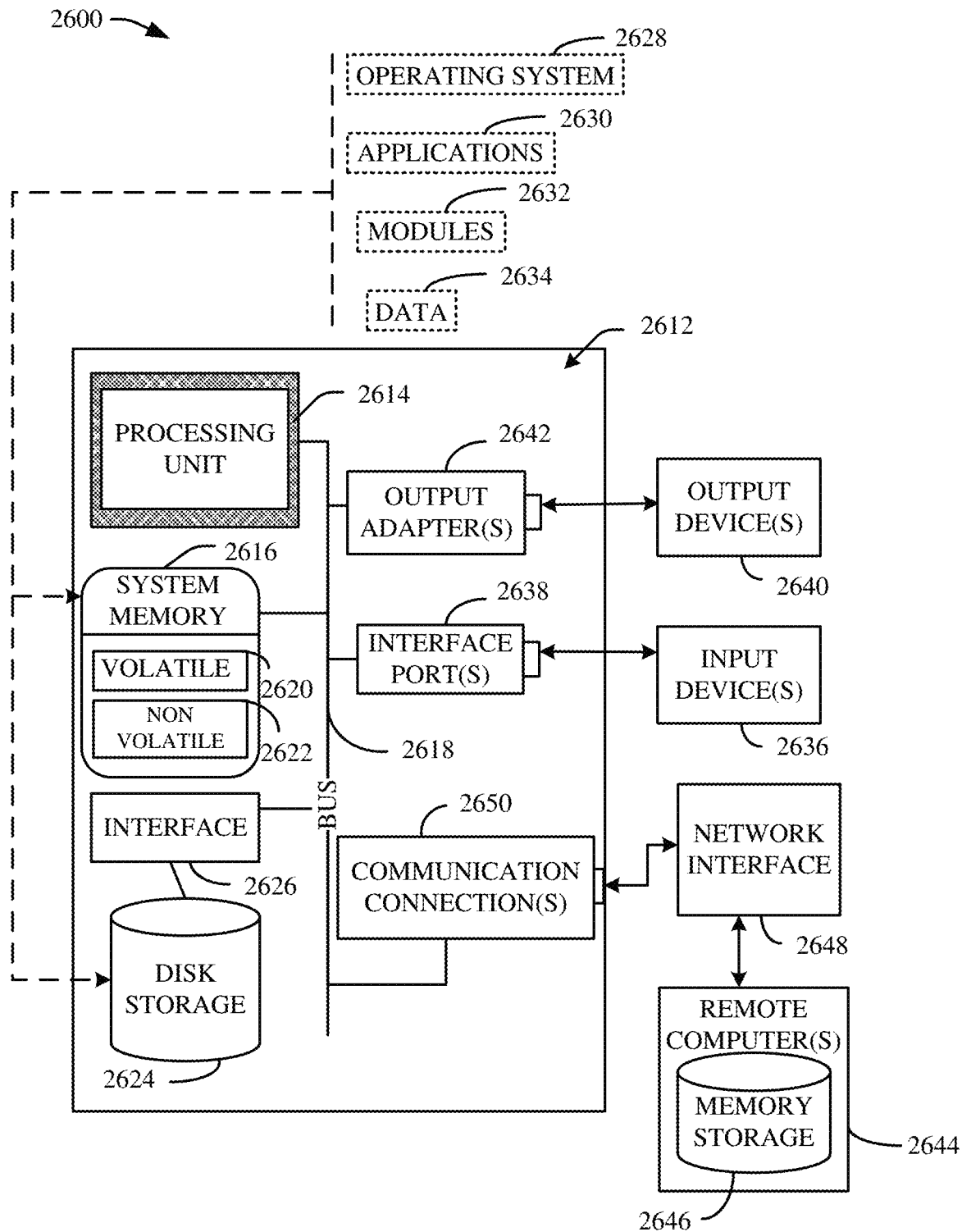
FIG. 26 illustrates a block diagram of an example, non-limiting operating environment in which one or more embodiments described herein can be facilitated.

In order to provide a context for the various aspects of the disclosed subject matter, FIG. 26 as well as the following discussion are intended to provide a general description of a suitable environment in which the various aspects of the disclosed subject matter can be implemented. FIG. 26 illustrates a block diagram of an example, non-limiting operating environment in which one or more embodiments described herein can be facilitated. For example, operating environment 2600 can be used to implement the example, non-limiting method 2500 of FIG. 25 which can facilitate implementation of one or more embodiments of the subject disclosure described herein. Repetitive description of like elements and/or processes employed in other embodiments described herein is omitted for sake of brevity.

With reference to FIG. 26, a suitable operating environment 2600 for implementing various aspects of this disclosure can also include a computer 2612. The computer 2612 can also include a processing unit 2614, a system memory 2616, and a system bus 2618. The system bus 2618 couples system components including, but not limited to, the system memory 2616 to the processing unit 2614. The processing unit 2614 can be any of various available processors. Dual microprocessors and other multiprocessor architectures also can be employed as the processing unit 2614. The system bus 2618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 2616 can also include volatile memory 2620 and nonvolatile memory 2622. The basic input/output system (BIOS), containing the basic routines to transfer information between elements within the computer 2612, such as during start-up, is stored in nonvolatile memory 2622. Computer 2612 can also include removable/non-removable, volatile/non-volatile computer storage media. FIG. 26 illustrates, for example, a disk storage 2624. Disk storage 2624 can also include, but is not limited to, devices like a magnetic disk drive, floppy disk drive, tape drive, Jaz drive, Zip drive, LS-100 drive, flash memory card, or memory stick. The disk storage 2624 also can include storage media separately or in combination with other storage media. To facilitate connection of the disk storage 2624 to the system bus 2618, a removable or non-removable interface is typically used, such as interface 2626. FIG. 26 also depicts software that acts as an intermediary between users and the basic computer resources described in the suitable operating environment 2600. Such software can also include, for example, an operating system 2628. Operating system 2628, which can be stored on disk storage 2624, acts to control and allocate resources of the computer 2612.

System applications 2630 take advantage of the management of resources by operating system 2628 through program modules 2632 and program data 2634, e.g., stored either in system memory 2616 or on disk storage 2624. It is to be appreciated that this disclosure can be implemented with various operating systems or combinations of operating systems. A user enters commands or information into the computer 2612 through input device(s) 2636. Input devices 2636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2614 through the system bus 2618 via interface port(s) 2638. Interface port(s) 2638 include, for example, a serial port, a parallel port, a game port, and a universal serial bus (USB). Output device(s) 2640 use some of the same type of ports as input device(s) 2636. Thus, for example, a USB port can be used to provide input to computer 2612, and to output information from computer 2612 to an output device 2640. Output adapter 2642 is provided to illustrate that there are some output devices 2640 like monitors, speakers, and printers, among other output devices 2640, which require special adapters. The output adapters 2642 include, by way of illustration and not limitation, video and sound cards that provide a means of connection between the output device 2640 and the system bus 2618. It should be noted that other devices and/or systems of devices provide both input and output capabilities such as remote computer(s) 2644.

Computer 2612 can operate in a networked environment using logical connections to one or more remote computers, such as remote computer(s) 2644. The remote computer(s) 2644 can be a computer, a server, a router, a network PC, a workstation, a microprocessor based appliance, a peer device or other common network node and the like, and typically can also include many or all of the elements described relative to computer 2612. For purposes of brevity, only a memory storage device 2646 is illustrated with remote computer(s) 2644. Remote computer(s) 2644 is logically connected to computer 2612 through a network interface 2648 and then physically connected via communication connection 2650. Network interface 2648 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2650 refers to the hardware/ software employed to connect the network interface 2648 to the system bus 2618. While communication connection 2650 is shown for illustrative clarity inside computer 2612, it can also be external to computer 2612. The hardware/ software for connection to the network interface 2648 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum computing device, comprising:
   a Majorana fermion device coupled to an ion implanted region external to the Majorana fermion device; and
   an encapsulation film layer coupled to the ion implanted region and a substrate layer, wherein the encapsulation film layer suspends the Majorana fermion device in the quantum computing device.

2. The device of claim 1, wherein the Majorana fermion device comprises an ion implant defined nanorod.

3. The device of claim 1, wherein the Majorana fermion device comprises a superconducting layer.

4. The device of claim 1, wherein the Majorana fermion device comprises:
   a superconducting layer coupled to an ion implant defined nanorod; and
   an oxidation free interface between the ion implant defined nanorod and the superconducting layer.

5. The device of claim 1, wherein the Majorana fermion device comprises at least one ion implant defined sensing region comprising at least one quantum dot.

6. The device of claim 1, further comprising an expanded electrode layer coupled to the Majorana fermion device that repels undesired quasiparticles from the Majorana fermion device.

7. The device of claim 1, further comprising:
   one or more wires coupled to the Majorana fermion device, wherein the one or more wires are selected from a group consisting of a control wire, a tunnel junction gate, a pinch gate, a chemical potential control gate, a sensing wire, a semiconductor connector, an electrode, a circuit wire of the device, and a contact.

8. The device of claim 1, wherein one or more sides of the Majorana fermion device are exposed to a hollow space of the quantum computing device to prevent direct contact of the Majorana fermion device with at least one of the substrate layer or a dielectric film of the quantum computing device, thereby facilitating at least one of: reduced quasiparticle generation in the Majorana fermion device; improved performance of the Majorana fermion device; or improved lifespan of the Majorana fermion device.

9. A method comprising:
   forming an ion implanted region external to and coupled to a Majorana fermion device in a quantum computing device; and
   forming an encapsulation film layer coupled to the ion implanted region and a substrate layer to suspend the Majorana fermion device in the quantum computing device.

10. The method of claim 9, further comprising:
    growing a nanorod on a semiconductor layer of the quantum computing device using an epitaxial film growth process; and
    growing a superconducting layer on the nanorod using the epitaxial film growth process to form an oxidation free interface between the nanorod and the superconducting layer.

11. The method of claim 9, further comprising:
    defining at least one electrically conductive region of a nanorod of the Majorana fermion device using an ion implantation process.

12. The method of claim 9, further comprising:
    defining at least one sensing region comprising at least one quantum dot on a nanorod of the Majorana fermion device using an ion implantation process.

13. The method of claim 9, further comprising:
    coupling an expanded electrode layer to the Majorana fermion device to repel undesired quasiparticles from the Majorana fermion device.

14. The method of claim 9, further comprising:
    removing one or more portions of at least one of the ion implanted region or the encapsulation film layer from the quantum computing device to expose one or more sides of the Majorana fermion device to a hollow space of the quantum computing device to prevent direct contact of the Majorana fermion device with at least one of the substrate layer or a dielectric film of the quantum computing device, thereby facilitating at least one of: reduced quasiparticle generation in the Majorana fermion device; improved performance of the Majorana fermion device; or improved lifespan of the Majorana fermion device.

15. A device, comprising:
a Majorana fermion device comprising:
   an ion implant defined nanorod,
   a quantum dot structure coupled to the ion implant defined nanorod, and
   a superconducting layer coupled to the ion implant defined nanorod.

16. The device of claim 15, wherein the Majorana fermion device comprises a Majorana qubit.

17. The device of claim 15, further comprising:
an oxidation free interface between the ion implant defined nanorod and the superconducting layer.

18. The device of claim 15, further comprising another ion implant defined nanorod coupled to the quantum dot structure.

19. The device of claim 15, further comprising an expanded electrode layer coupled to the Majorana fermion device that repels undesired quasiparticles from the Majorana fermion device.

20. The device of claim 15, further comprising:
one or more wires coupled to at least one of the Majorana fermion device, the ion implant defined nanorod, or the superconducting layer, wherein the one or more wires are selected from a group consisting of a control wire, a tunnel junction gate, a pinch gate, a chemical potential control gate, a sensing wire, a semiconductor connector, an electrode, a circuit wire of the device, and a contact.

* * * * *